US005394368A

United States Patent [19]
Miyamoto

[11] Patent Number: 5,394,368
[45] Date of Patent: Feb. 28, 1995

[54] SEMICONDUCTOR MEMORY DEVICE

[75] Inventor: Sampei Miyamoto, Tokyo, Japan

[73] Assignee: Oki Electric Industry Co., Ltd., Tokyo, Japan

[21] Appl. No.: 50,231

[22] PCT Filed: Aug. 28, 1991

[86] PCT No.: PCT/JP91/01142

§ 371 Date: Jun. 21, 1993

§ 102(e) Date: Jun. 21, 1993

[87] PCT Pub. No.: WO93/05512

PCT Pub. Date: Mar. 18, 1993

[51] Int. Cl.⁶ ................ G11C 11/407; G11C 29/00
[52] U.S. Cl. ........................... 365/200; 365/230.06; 365/225.7
[58] Field of Search ............ 365/200, 230.06, 225.7; 371/10.1, 10.2, 10.3

[56] References Cited

U.S. PATENT DOCUMENTS 4,346,459 8/1982 Sud et al. ............... 365/200
4,672,581 6/1987 Waiker ................... 365/200

FOREIGN PATENT DOCUMENTS 57-208694A 12/1982 Japan.
60-109099A 6/1985 Japan.
60-178552 9/1985 Japan.
61-61300A 3/1986 Japan.
63-142599A 6/1988 Japan.
1-229498A 9/1989 Japan.

Primary Examiner—Joseph A. Popek
Attorney, Agent, or Firm—Spencer, Frank & Schneider

[57] ABSTRACT

A semiconductor memory device having a redundancy circuit having a large flexibility, wherein a plurality of fuse columns are operated by address signals.

106 Claims, 10 Drawing Sheets

SEMICONDUCTOR MEMORY DEVICE

BACKGROUND OF THE INVENTION

1. Field of the Invention

The present invention relates to a semiconductor memory device, particularly to a semiconductor memory device having a defective bit relieving circuit.

2. Background Information

A defective bit relieving circuit (redundancy circuit) replaces a defective memory cell with a spare memory cell and is very convenient for improving the production yield of a semiconductor memory.

Accordingly, the redundancy circuit is currently widely used in many semiconductor memories and is disclosed in various publications such as Japanese Patent Laid-Open Publication No. 1-229498 issued on Sep. 13, 1989 and U.S. Pat. No. 4,346,459 issued on Aug. 24, 1982.

The present invention, described below, should be understood together with the known redundancy circuits as disclosed in these publications. The object of the present invention is to provide a redundancy circuit which is more flexible than that disclosed in these publications.

SUMMARY OF THE INVENTION

To achieve the above object, the semiconductor device according to the invention employs a main select line group having first and second select lines, a redundancy select line group having third and fourth select lines, a first select line activation circuit for activating one of the select lines in the main select line group in response to first and second signals, wherein the first select line activation circuit can activate the first select line when the first control signal is at a first potential level and activate the second select line when the first control signal is at a second potential level, a second select line activation circuit for activating one of the select lines in the redundancy select line group in response to the first and second control signals, wherein the first select line activation circuit can activate the third select line when the first control signal is at the first potential level and activate the fourth select line when the first control signal is at the second potential level, a first conductive line having a first terminal which receives either the first control signal or a signal having substantially the same potential level as that of the first control signal, a first node coupled to the first terminal and a first conductive portion connecting between the first terminal and the first node, a first potential supply circuit for causing the first node to be at substantially either the same potential level as that of the first or second potential level when the first conductive portion is blown, a second conductive line having a second terminal which receives a third control signal which has a complementary relationship with the first control signal, a second node coupled to the second terminal and a second conductive portion connecting between the second terminal and the second node, a second potential supply circuit for causing the second node to be at substantially the same potential level as that of the first or second potential level when the second conductive portion is blown, and a control signal generating circuit for outputting the second control signal to the second select line activation circuit when the first node and the second node have a predetermined relation to each other, and outputting the second control signal to the first select line activation circuit otherwise.

The present application discloses other various aspects of the inventions for achieving the object set forth above which will be understood from claims and various embodiments, described hereinafter and in the drawings.

DESCRIPTION OF THE PREFERRED EMBODIMENTS

Figure 1:
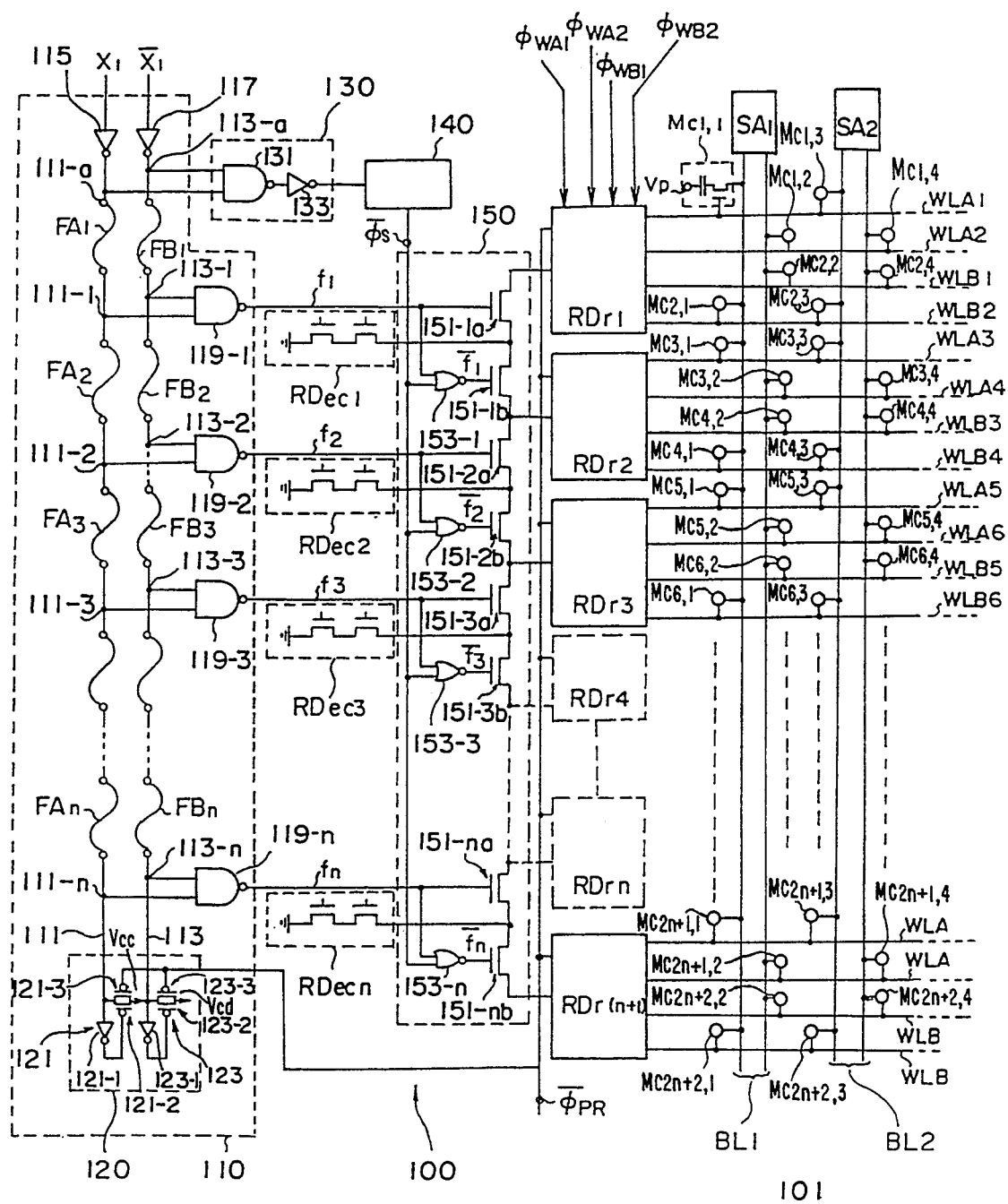
FIG. 1 is a circuit diagram of a first embodiment of the present invention.

A semiconductor device 100 according to a first embodiment of the present invention includes a memory cell array 101 having memory cells Mc as illustrated in FIG. 1. FIG. 1 shows $Mc_{1,1}$ to $Mc_{2n+2,4}$ which exemplify memory cells in the memory cell array 101. Each memory cell Mc has the same structure as that of the memory cell $Mc_{1,1}$, namely, each memory cell Mc comprises a transistor in which a gate is coupled to a word line WL, one of a source and a drain is coupled to a bit line BL and the other of the source and the drain is coupled to one electrode of a capacitor, and a plate potential Vp (e.g. $\frac{1}{2}$ Vcc) is applied to the other electrode of the capacitor.

Data may be read from the memory cell Mc of the memory cell array 101 in the following steps.

One word line WL among word lines WLA1 to WLB (2n+2) (where the word lines are divided into a main select line group having first select lines WLA1–WLA2n and second select lines WLB1–WLB2n and a redundancy select line group having third select lines WLA2n+1–WLA2n+2 and fourth select lines WLB2n+1–WLB2n+2) is activated (e.g. to power supply voltage level Vcc) by a row driver RDr (first select line activation circuit RDr1–RDrn and second select line activation circuit RDr (n+1), described below. Each transistor of the memory cells in the same row group which is coupled to the activated word line WL (for example, the memory cells $Mc_{1,1}$, $Mc_{1,3}$ when the word line WLA1 is selected), turns ON and a potential corresponding to the amount of electric charge stored in the capacitor coupled to this transistor appears on the bit line BL coupled to this transistor.

When the word line WLA1 is selected, the potential corresponding to the data stored in the memory cell $Mc_{1,1}$ appears on one of a pair of bit lines BL1 and the potential corresponding to the data stored in the memory cell $Mc_{1,3}$ appears on one of a pair of bit lines BL2. These pairs of bit lines BL1 and BL2 have the same potential (e.g. ½ Vcc) before the transistor of the memory cell is ON and are coupled respectively to sense amplifiers $SA_1$ and $SA_2$. These sense amplifiers SAs are provided corresponding to a column group of the memory cells (e.g. the sense amplifier $SA_1$ corresponds to memory cells $Mc_{1,1}$ and $Mc_{2n+2,2}$) for amplifying and outputting potential between the pair of bit lines. Accordingly, when the word line WLA1 is selected, the potential difference between one bit line coupled to the memory cell $Mc_{1,1}$ and the other bit line of pair of bit lines BL1 is amplified and output from the sense amplifier $SA_1$ as the data of the memory cell $Mc_{1,1}$. and the potential difference between one bit line coupled to the memory cell $Mc_{1,3}$ and the other bit line of pair of bit lines BL2 is amplified and output from the sense amplifier $SA_2$ as the data of the memory cell $Mc_{1,3}$.

The row driver RDr, which selects the word lines, will be described.

According to the first embodiment, one row driver RDr is provided for every four word lines. Accordingly, (n+1) row drivers RDr1 to RDr (n+1) are provided relative to the word lines WLA1 to WLB (2n+2). The row driver RDr (n+1) is a redundancy row driver, described below. The word lines WLA (2n+1) to WLB (2n+2) and the memory cells $MC_{2n+1,1}$ to $MC_{2n+2,4}$ are coupled to the redundancy row driver Rdr (n+1) in which the former can be called redundancy word lines and the latter called redundancy memory cells.

Figure 2:
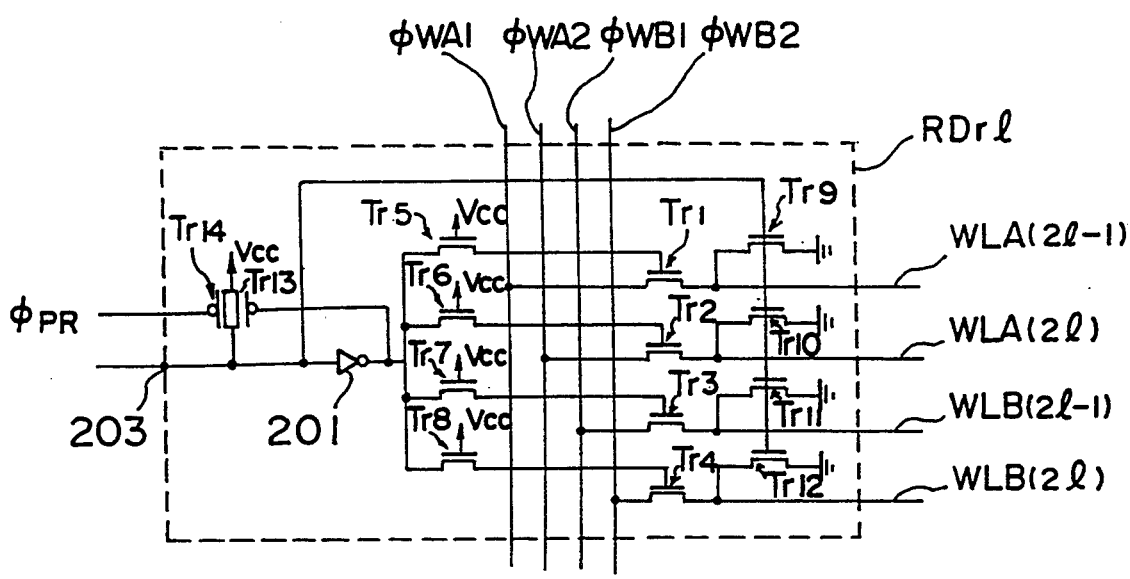
FIG. 2 is a circuit diagram of a row driver RDr in FIG. 1.

FIG. 2 shows an arrangement of an row driver RDr1 which typically represents the row drivers RDr1 to RDr (n+1).

The row driver RDr1 includes N-channel transistors Tr1, Tr2, Tr3 and Tr4, each having one of the source or drain coupled to the corresponding word line WLA (2l−1), WLA (2l), WLB (2l−1) and WLB (2l) and the other of the source or drain coupled to a corresponding row line drive signal $\phi WA1$, $\phi WA2$, $\phi WB1$ and $\phi WB2$. An output of an inverter 201 is coupled to gates of the transistors Tr1 to Tr4 via N-channel transistors Tr5, Tr6, Tr7 and Tr8, respectively, whose gates are connected to power supply voltage Vcc. The row line drive signals $\phi WA1$, $\phi WA2$, $\phi WB1$ and $\phi WB2$ are generated by a row line drive signal generator 300 as illustrated in FIG. 3.

Figure 4:
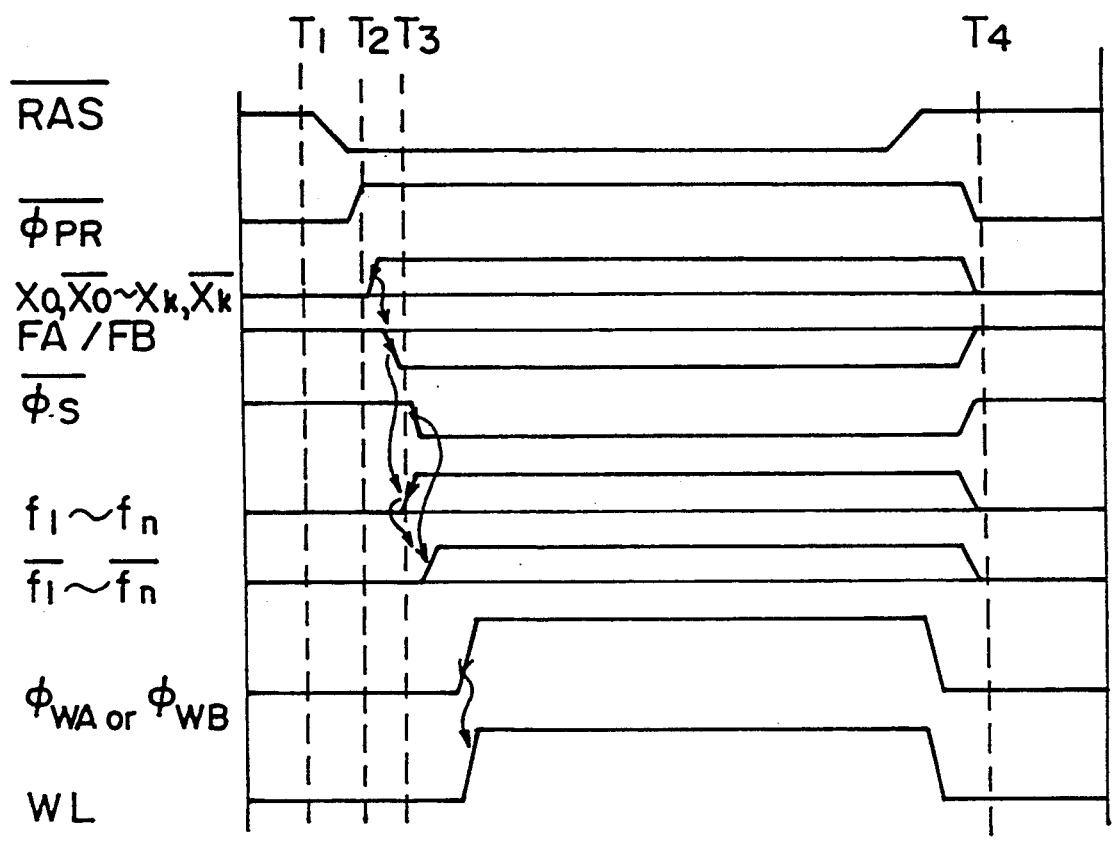
FIG. 4 is a timing chart of each signal in FIG. 1.

The row line drive signal generator 300 is responsive to internal row address (complementary) signals $X_0$, $\overline{X}_0$ (inverted $X_0$), $X_1$ (first control signal) and $\overline{X}_1$ (inverted $X_1$ and third control signal) from a known internal row address generator 350 and generates the row line drive signals $\phi WA1$ to $\phi WA2$ (fourth control signal). The internal row address (complementary) signals $X_k$ and $\overline{X}_k$ are generated in response to external address signals which are generated by multiplexing row address signals and column address signals supplied from an external device of the semiconductor device. A typical semiconductor device (e.g. 4 Mbit DRAM MSM514100 manufactured by Oki Electric Industry Co., Ltd.) is provided with a circuit for generating internal row address signals $X_0$, $\overline{X}_0$ ... $X_k$, $\overline{X}_k$ in response to external address signals $A_0$ to $A_k$ and internal column address signals $Y_0$, $\overline{Y}_0$ ... $Y_k$, $\overline{Y}_k$, described below. As illustrated in FIG. 4, the internal row address signals $X_0$, $\overline{X}_0$ ... $X_k$, $\overline{X}_k$ are all held LOW (e.g. Vss level) during the time when a external inverse row address strobe signal $\overline{RAS}$ of TTL level (hereinafter referred to as the $\overline{RAS}$ signal) is HIGH (at least 2.4 V) and are responsive to an external address signal Ai after the $\overline{RAS}$ signal goes LOW (less than 0.8 V), whereby one of the complementary internal row address signals $X_i$ and $\overline{X}_i$ goes HIGH (e.g. Vcc level) and the other signal goes LOW.

Figure 3:
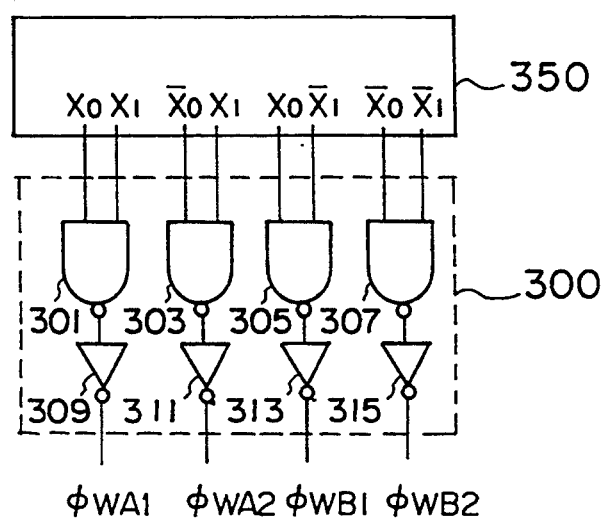
FIG. 3 is a circuit diagram of a circuit for generating row line drive signals in FIG. 1.

In the row line drive signal generator 300 as illustrated in FIG. 3, the internal row address signals $X_0$, $\overline{X}_0$, $X_1$ and $\overline{X}_1$, which are low order bits of the internal row address signals $X_0$, $\overline{X}_0$ ... $X_k$, $\overline{X}_k$, are applied to two-input NAND gates 301, 303, 305 and 307.

The NAND gate 301 receives the internal row address signals $X_0$ and $X_1$ and applies a low level output to an input terminal of an inverter 309 only if both the signals $X_0$ and $X_1$ are HIGH and applies a high level output to the input terminal of the inverter 309 in all other cases. Accordingly, the row line drive signal $\phi WA1$ output from the inverter 309 goes HIGH (e.g. Vcc level) only when both the internal row address signals $X_0$ and $X_1$ are HIGH.

Likewise, the NAND gate 303 outputs a HIGH row line drive signal $\phi WA2$ via an inverter 311 only if both the internal row address signals $\overline{X}_0$ and $X_1$ are HIGH. The NAND gate 305 outputs a HIGH row line drive signal $\phi WB1$ via an inverter 313 only if both the internal row address signals $X_0$ and $\overline{X}_1$ are HIGH. The NAND gate 307 outputs a HIGH row line drive signal $\phi WB2$ via an inverter 315 only if both the internal row address signals $\overline{X}_0$ and $\overline{X}_1$ are HIGH.

Accordingly, one of the row line drive signals $\phi WA1$, $\phi WA2$, $\phi WB1$ and $\phi WB2$, which are generated by the row line drive signal generator 300 according to the combinations of the levels of $X_0$, $\overline{X}_0$, $X_1$ and $\overline{X}_1$ described above, goes HIGH and the other three row line drive signals thereof go LOW if the $\overline{RAS}$ signal is LOW and the row line drive signal generator 300 receives the external address signals $A_0$ and $A_1$.

If internal row address signal $X_1$ is HIGH, one of the row line drive signals $\phi WA1$ and $\phi WA2$ goes HIGH, a word line corresponding to one of word lines WLA (2l−1) or WLA (2l) coupled to the row line drive signals $\phi WA1$ or $\phi WA2$ can be activated. If internal row address signal $X_1$ is LOW, namely, the signal $\overline{X}_1$ is HIGH, one of the row line drive signals $\phi WB1$ and $\phi WB2$ goes HIGH, hence a word line, corresponding to one of word lines WLB (2l−1) or WLB (2l) coupled to the row line drive signals $\phi WB1$ or $\phi WB2$, can be activated. Accordingly, the word lines WLA (2l−1) and WLA (2l), either of which can be activated when the internal row address signal $X_1$ is HIGH, are defined as a first word line group and the memory cells coupled to the first word line group are defined as a first memory cell group. The word lines WLB (2l−1) and WLB (2l), either of which can be activated when the internal row address signal $X_1$ is LOW ($\overline{X}_1$ is HIGH) are defined as a second word line group and the memory cells coupled to the second word line group are defined as a second memory cell group.

Referring again to FIG. 2, the row driver RDr1 will be described in more detail. The row driver RDr1 includes N-channel transistors Tr9, Tr10, Tr11 and Tr12 whose drains are coupled to electrodes of the transistors Tr1, Tr2, Tr3 and Tr4 which are coupled to the word lines WLA (2l−1), WLA (2l), WLB (2l−1) and WLB (2l), respectively. Sources of the transistors Tr9, Tr10, Tr11 and Tr12 are grounded (Vss) and gates thereof are coupled commonly to the input terminal of the inverter 201. The inverter 201 receives a control signal from a row decoder, described below, at an input node 203 and is coupled to drains of a pair of P-channel transistors Tr13 and Tr14 which have sources coupled commonly to the power supply voltage Vcc. A gate of the transistor Tr13 is coupled to an output terminal of the inverter 201, and a gate of the transistor Tr14 receives a precharge signal $\overline{\phi}_{PR}$. The precharge signal $\overline{\phi}_{PR}$ goes HIGH (Vcc level) after the $\overline{RAS}$ signal drops (goes to LOW level) and the precharge signal $\overline{\phi}_{PR}$ goes LOW (Vss level) after the internal row address signals $X_0$, $\overline{X}_0$ ... $X_k$, $\overline{X}_k$ all go LOW as illustrated in FIG. 4. The precharge signal $\overline{\phi}_{PR}$ is fundamentally responsive to the variation of the $\overline{RAS}$ signal although there is a delay and is generated by a known precharge signal generator, not shown.

The operation of the row driver RDrl as illustrated in FIG. 2 will be described below.

When the precharge signal $\overline{\phi}_{PR}$ is kept LOW, the P-channel transistor Tr14 is ON, hence a high level signal (substantially Vcc level) is applied to the input terminal of the inverter 201 irrespective of the potential at the input node 203. Accordingly, the inverter 201 outputs a low level signal (Vss level) so that the N-channel transistors Tr1, Tr2, Tr3 and Tr4 are all OFF while the P-channel transistor Tr13 is ON. The word lines WLA (2l−1), WLA (2l), WLB (2l−1) and WLB (2l) are kept at ground potential since the N-channel transistors Tr9, Tr10, Tr11 and Tr12 having gates which are commonly coupled to the input terminal of the inverter 201 are ON.

When the precharge signal $\overline{\phi}_{PR}$ goes HIGH, the P-channel transistor Tr14 goes OFF so that the row driver RDrl is operable when the low level control signal (e.g. Vss level) is applied to the input node 203 from the row decoder. When the low level control signal is not applied to the input node 203, the row driver RDrl is inoperable in the same way as if the transistor Tr14 is ON since the input terminal of the inverter 201 is kept HIGH while the output terminal thereof is kept LOW due to the coupling relation between the inverter 201 and the P-channel transistor Tr13 as illustrated in FIG. 2 even if the transistor Tr14 is OFF.

When a low level control signal is applied to the input node 203, the output signal of the inverter 201 is HIGH so that the transistor Tr13 is OFF in the same way as the transistor Tr14 while the transistors Tr1, Tr2, Tr3 and Tr4 are ON. The transistors Tr9 to Tr12 are OFF since the input terminal of the inverter 201 receives the low level control signal. As a result, the word lines WLA (2l−1), WLA (2l), WLB (2l−1) and WLB (2l) can respond to the corresponding potential levels of the row line drive signals $\phi$WA1, $\phi$WA2, $\phi$WB1 and $\phi$WB2, respectively.

When the precharge signal $\overline{\phi}_{PR}$ goes from HIGH to LOW, the row drive RDr is again inoperable. The precharge signal $\overline{\phi}_{PR}$ is caused to go LOW after internal row address signals $X_0$, $\overline{X}_0$ ... $X_k$, $\overline{X}_k$, all go LOW so as to prevent power supply consumption due to the generation of direct current from the row driver to the row decoder. Such timing regulation is generally carried out in the DRAM circuit.

The row decoders RDr$_{ec}$1 to RD$_{ec}$n in FIG. 1 will be described in more detail with reference to FIG. 5.

Figure 5:
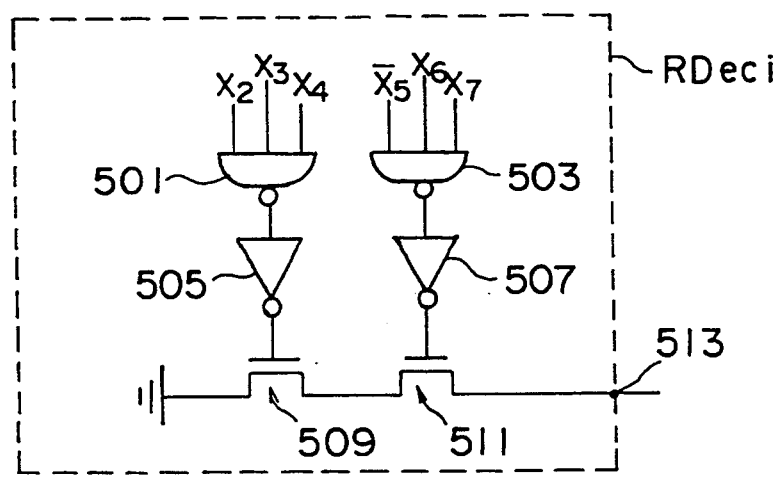
FIG. 5 is a circuit diagram of a row decoder in FIG. 1.

The row decoder RD$_{ec}$i in FIG. 5 represents the row decoders RD$_{ec}$1 to RD$_{ec}$n in FIG. 1 and is controlled by internal row address signals $X_2$, $\overline{X}_2$ ... $X_7$, $\overline{X}_7$. A first NAND gate 501 receives, e.g. the internal row address signals $X_2$, $X_3$ and $X_4$ which are one of eight combinations of the internal row address signals $X_2$, $\overline{X}_2$, $X_3$, $\overline{X}_3$, $X_4$ and $\overline{X}_4$ and outputs a low level control signal only when all the input internal row address signals are HIGH. An inverter 505, upon reception of the low level control signal, outputs a high level signal which turns on an N-channel transistor 509.

A second NAND gate 503 receives, e.g. the internal row address signals $\overline{X}_5$, $X_6$ and $X_7$ which are one of eight combinations of the internal row address signals $X_5$, $\overline{X}_5$, $X_6$, $\overline{X}_6$, $X_7$ and $\overline{X}_7$, and outputs a high level control signal via an inverter 507 only when all the input internal address signals are HIGH, which turns on an N-channel transistor 511. Accordingly, the row decoder RD$_{ec}$i causes the potential level of an output node 513 to be substantially at ground level (Vss level) to thereby output the low level control signal.

The number of the row decoders RD$_{ec}$i to be controlled by the internal row address signals $X_2$, $\overline{X}_2$ ... $X_7$, $\overline{X}_7$ is 64 and the number of the internal row address signals may be further increased if more row decoders are necessitated.

The arrangement of the row decoder RD$_{ec}$i set forth above is a general one in which one output control signal among the row decoders is caused to be LOW so as to activate a corresponding row driver coupled to the output node 513.

Referring to FIG. 1, a defect decision circuit 110 will be described in more detail.

The defect decision circuit 110 shows first and second columns of fuses 111 and 113, respectively, each column composed of n fuses, which are coupled to one another in series, corresponding to (n+1) row drivers (one of them is a redundancy row driver). The first column of fuses 111, serving as a first conductive portion or line, includes a first terminal 111-a, which receives the internal row address signal $X_1$ via an inverter 115, and n firsth to nth nodes 111-1 to 111-n. N fuse elements FA1 to FAn composing the wiring portion are provided between the first terminal 111-a and the first node 111-1 and between consecutive nodes. The second column of fuses 113, serving as a second conductive portion or line, includes a second terminal 113-a, which receives the internal row address signal $\overline{X}_1$ via an inverter 117, and n first to nth nodes 113-1 to 113-n. The second terminal 113-a and the first node 113-1 and consecutive nodes are coupled by the n fuse elements FB1 to FBn composing a conductive portion.

The defect decision circuit 110 further includes the first to nth NAND gates 119-1 to 119-n serving as n first detecting circuits. Two input terminals of the first NAND gate 119-1 have one terminal coupled to the first node 111-1 of the first column of fuses 111 and the other terminal coupled to first node 113-1 of the second column of fuses 113. The first NAND gate 119-1 outputs a low level control signal $f_1$ only when the pair of first nodes 111-1 and 113-1 are HIGH (Vcc level) and outputs a high level control signal $f_1$ in all other cases.

Likewise, a second NAND gate 119-2 to nth NAND gate 119-n detect the relation between the potential levels at second nodes 111-2 and 113-2 to nth nodes 111-n and 113-n, respectively and outputs low level control signals $f_2$ to $f_n$ when the potential level of the pairs of nodes are both HIGH and outputs high level control signals $f_2$ to $f_n$ when either of the potential levels of the pairs of nodes are not HIGH.

The defect decision circuit 110 further includes a second detection circuit 130 for detecting the potential relation between the first terminal 111-a and the second terminal 113-a. The second detection circuit 130 comprises a NAND gate 131 having input terminals coupled to the first terminal 111-a and the second terminal 113-a, and an inverter 133 whose input is coupled to the output of the NAND gate 131. The second detection circuit 130 detects when internal row address signals $X_1$ and $\overline{X}_1$ go from low levels to the levels of a complementary potential relation (one is HIGH and the other is LOW) wherein the NAND gate 131 outputs a low level signal to the inverter 133 when the internal row address signals $X_1$ and $\overline{X}_1$ are LOW and the inverter 133 outputs a high level detection signal to a delay circuit 140. When the internal row address signals $X_1$ and $\overline{X}_1$ are in complementary potential relation to each other, the second detection circuit 130 outputs a low level detection signal to delay circuit 140. The delay circuit 140 has plural stages of inverter circuits of known type. The delay circuit 140 outputs a low level control signal $\overline{\phi}_s$ having the same potential level as the detection signal from second detection circuit 130 when a given time lapses upon reception of the low level detection signal. The given delay time of the delay circuit 140 is equal to or longer then the time period ranging from the time when the second detection circuit 130 detects the variation of the potential relation between the first and the second terminals 111-a and 113-a at the state where all the fuse elements FA1 to FBn of the first and second columns of fuses 111 and 113 are not blown to the time when the NAND gate 119-n detects the same potential relation between the nth nodes 111-n and 113-n as between the first and second terminals 111-a and 113-a.

The delay time should be set to prevent the delay of the transmission of the internal row address signals $X_1$ and $\overline{X}_1$ due to the fuse elements having parasitic resistances and also for assuring the selection of a row driver, described below. Nonmetallic materials having large parasitic resistances such as polysilicon or polyside, etc. are generally employed for fuse elements since they can easily be blown by a laser, etc.

The control signal $\overline{\phi}_s$ from delay circuit 140 is applied to a row driver selection circuit 150 (control signal generating circuit whose output is a second control signal). The row driver selection circuit 150 includes columns of N-channel transistors 151-1a, 151-1b to 151-na and 151-nb composed of n pairs of N-channel transistors 151-ia and 151-ib (i is natural number and i≦n) which are coupled in series. A drain of the N-channel transistor 151-1a is coupled to the input terminal of the inverter 201 in the row driver RDr1 (refer to FIG. 2) and a drain of the N-channel transistor 151-1b is coupled to the input terminal of the inverter 201 in the row driver RDr2. Sources of the first pair of N-channel transistors 151-1a and 151-1b are commonly coupled to the output terminal of the row decoder RD$_{ec}$1. Furthermore, the gate of the N-channel transistor 115-1a is coupled to the output terminal of the NAND gate 119-1 while the gate of the N-channel transistor 151-1b is coupled to the output terminal of a two-input NOR gate 153-1. One input terminal of the NOR gate 153-1 is coupled to the output terminal of the NAND gate 119-1 and the other input terminal thereof is coupled to the output terminal of the delay circuit 140.

Each pair of N-channel transistors 151-2a and 151-2b to 151-na and 151-nb is coupled to other elements in the same way as the first pair of N-channel transistors 151-1a and 151-1b as set forth above. For example, regarding the nth pair of N-channel transistors 151-na and 151-nb, the drain of the N-channel transistor 151-na is coupled to the input node 203 of the row driver RDrn, not shown, while the drain of the N-channel transistor 151-nb is coupled to the input node 203 of the row driver RDr(n+1). Sources of the N-channel transistors 151-na and 151-nb are commonly coupled to the output terminal of the row decoder RD$_{ec}$n and the gate of the transistor 151-na is coupled to the output terminal of the NAND gate 119-n and the gate of the transistor 151-nb is coupled to the output terminal of the NOR gate 153-n, whose input terminals are coupled to the output terminals of the delay circuit 140 and NAND gate 119-n.

Described below is the operation of the defect decision circuit 110 and the operation of the row driver selection circuit 150 which is controlled by the defect decision circuit 110.

The first column of fuses 111 and the second column of fuses 113 have commonly a fuse clamping circuit 120, serving as a potential holding circuit, which is coupled to the nth node 111-n of the first column of fuses 111 and the nth node 113-n of the second column of fuses 113.

The fuse clamping circuit 120 comprises a first clamping circuit 121 (first potential supply means) and a second clamping circuit 123 (second potential supply means). The first clamping circuit 121 has an inverter 121-1 having an input terminal coupled to the nth node 111-n of the first column of fuses 111 and P-channel transistors 121-2 and 121-3 which are coupled in parallel with each other between the input terminal of the inverter 121-1 and the power supply Vcc. Drains of the P-channel transistors 121-2 and 121-3 are commonly coupled to the input terminal of the inverter 121-1 and sources thereof are commonly coupled to the power supply Vcc. The gate of the P-channel transistor 121-3 is controlled by the precharge signal $\overline{\phi}_{PR}$. Likewise, the second clamping circuit 123 has an inverter 123-1 having an input terminal coupled to the nth node 113-n of the second column of fuses 113 and P-channel transistors 123-2 and 123-3 which are coupled in parallel with each other between the input terminal of the inverter 123-1 and the power supply Vcc. Drains of the P-channel transistors 123-2 and 123-3 are commonly coupled to the input terminal of the inverter 123-1 and sources thereof are commonly coupled to the power supply Vcc. The gate of the P-channel transistor 123-2 is coupled to the output terminal of the inverter 123-1 and the gate of the P-channel transistor 123-3 is controlled by the precharge signal $\overline{\phi}_{PR}$.

The defect decision circuit 110 provided with the fuse clamping circuit 120 having the arrangement set forth above operates as follows.

Since the precharge signal $\overline{\phi}_{PR}$ is LOW at time $T_1$, the P-channel transistors 121-3 and 123-3 of the fuse clamping circuit 120 are both turned ON to thereby cause the input terminals of the inverters 121-1 and 123-1 to be HIGH (substantially Vcc level).

As a result, both the inverters 121-1 and 123-1 apply low level outputs to the P-channel transistors 121-2 and 123-2 whereby both the transistors 121-2 and 123-2 are turned ON. Each of the nth nodes 111-n and 113-n of the first and second columns of fuses 111 and 113, respectively, coupled to the fuse clamping circuit 120 go HIGH. Each of the nodes 111-i and 113-i, which are respectively electrically coupled to each of the nth nodes 111-n and 113-n via the fuse elements FA and FB goes HIGH.

Meanwhile, since the internal row address signals $X_1$ and $\overline{X}_1$ are both LOW at time $T_1$, both the outputs of the inverters 115 and 117 go HIGH so that the input terminals 111-a and 113-a coupled to the inverters 115 and 117, respectively, also go HIGH. Furthermore, each of the nodes 111-j and 113-j (j is a natural number and j≦n), which are respectively electrically coupled to the input terminals 111-a and 113-a via fuse elements FA and FB goes HIGH.

Accordingly, all the nodes 111-1 to 113-n and the first and second terminals 111-a and 113-a of both columns of fuses 111 and 113 go HIGH at time $T_1$ because the number of the fuse elements FAi and FBi which are blown or nonconductive among each of the first and second columns of fuses 111 and 113 is a maximum of one.

When the precharge signal $\overline{\phi}_{PR}$ goes HIGH at time $T_2$, although both the transistors 121-3 and 123-3 of the fuse clamping circuit 120 turn OFF, both the outputs of the inverters 121-1 and 123-1 are LOW and both the transistors 121-2 and 123-2 are held ON, both the nth nodes 111-n and 113-n stay HIGH.

After the precharge signal $\overline{\phi}_{PR}$ is HIGH at time $T_3$, the potential relation between the internal row address signals $X_1$ and $\overline{X}_1$ become complementary, namely, one becomes LOW and the other becomes HIGH. Described below is the case in which internal row address signal $X_1$ goes HIGH.

When the internal row address signal $X_1$ goes HIGH, the first terminal 111-a goes LOW as the low level output from the inverter 115. Successively, each of the nodes 111-1 to 111-n of the first column of fuses 111 goes LOW provided that the fuse elements FA1 to FAn are all conductive. Since the inverter 121-1 receives a low level signal via the nth node, inverter 121-1 outputs a high level signal. The transistor 121-2 turns OFF upon reception of the high level output from the inverter 121-1 so that the nth node 111-n is separated from the power supply Vcc.

When one of the fuse elements among the fuse elements FA1 to FAn, e.g. FA2 is blown or nonconductive, the first terminal 111-a and the first node 111-1 go LOW, the second node 111-2 to the nth node 111-n are all held HIGH by the first clamping circuit 121.

Although the case where the internal row address $X_1$ goes HIGH has been described above, when the internal row address $X_1$ goes HIGH, the potential level of each of the nodes 113-1 to 113-n in the second column of fuses 113 and the second terminal 113-a vary in the same way as the case where the internal row address $X_1$ goes HIGH.

Furthermore, when the precharge signal $\overline{\phi}_{PR}$ and the internal row addresses $X_1$ and $X_1$ all go LOW at time $T_4$, all the nodes 111-1 to 113-n go HIGH again. As a result, the precharge signal $\overline{\phi}_{PR}$ can be also defined as a signal to reset fuse clamping circuit 120.

Described below is the operation of the row driver selection circuit 150 in the case where fuse elements FA3 and FB2 are blown.

When the internal row address signal $X_1$ goes HIGH and $X_1$ goes LOW, the second detection circuit 130 outputs a low level control signal $\overline{\phi}_s$ via the delay circuit 140. The NAND gates 119-1 and 119-2 output high level detection signals $f_1$ and $f_2$ and the NAND gates 119-3 to 119-n output the low level detection signals $f_3$ to $f_n$. The transistors 151-1a and 151-2a, whose gates have the high level detection signals $f_1$ and $f_2$ applied, turn ON and the transistors 151-3a to 151-na, whose gates have the low level detection signals $f_3$ to $f_n$ applied, turn OFF. Since the transistors 151-1b and 151-2b receive the low level control signals $\overline{f}_1$ and $\overline{f}_2$, at each gate thereof which are output from the NOR gates 153-1 and 153-2, respectively, the transistors 151-1b and 151-2b turn OFF. Since the transistors 151-3b to 151-nb receive the high level control signals $\overline{f}_3$ to $\overline{f}_n$ at each gate thereof from the NOR gates 153-3 to 153-n, respectively to which either the low level control signal $\overline{\phi}_s$ or the low level control signals $f_3$ to $f_n$ are applied, they turn ON. The output of one of the row decoders $RD_{ec}1$ to $RD_{ec}n$ selected by the internal row address signals $X_2$, $X_2$ ... $X_7$, $X_7$ is connected through transistors 509 and 511 so that the output goes LOW (substantially ground level).

When the output of the row decoder $RD_{ec}1$ or $RD_{ec}2$ goes LOW, the low level control signal is applied to the row decoder RDr1 or RDr2 via the transistor 151-1a or 151-2a, respectively. When one of the output signals of the row decoders $RD_{ec}3$ to $RD_{ec}n$ goes LOW, the low level control signal is applied to one of the corresponding row drivers RDr4 to RDr(n+1) via one of the transistors 151-3b to 151-nb. Accordingly, the row driver RDr3 does not receive the row level control signal when the fuse element FA3 is blown while the internal row address signal $X_1$ is HIGH.

Since the row drivers RDr1 to RDr(n+1) are enabled upon reception of the low level control signal from the row decoders as illustrated in FIG. 2 and the row line drive signal is $\phi$WA1 or $\phi$WA2 which can go HIGH when the internal row address signal $X_1$ is HIGH, any of the word line group, i.e. word lines WLA1 to WLA(2n=2) except the word lines WLA5 and WLA6 can be activated by the row driver RDr when it receives the low level control signal. In other words, when the fuse element FAi is blown according to the first embodiment, both the word line WLA(2i−1) and the word line WLA2i which are activated by the row driver RDri in logical address are replaced by the word line WLA(2i+1) and WLA(2i+2), respectively, which are activated by the row driver RDr(i+1) in physical address.

Successively, in the same condition, i.e. in the condition where the fuse elements FA3 and FB2 are blown, if the internal row address signal $X_1$ goes LOW and the internal row address signal $X_1$ goes HIGH, the second detection circuit 130 outputs the low level control signal $\overline{\phi}_s$ via the delay circuit 140. The NAND gate 119-1 outputs a high level detection signal $f_1$ and the NAND gates 119-2 to 119-n output the low level detection signals $f_2$ to $f_n$. The transistor 151-1a to which the high level detection signal $f_1$ is applied at the gate thereof and the transistors 151-2b to 151-nb to which the high level inverse detection signals $\overline{f}_2$ to $\overline{f}_n$ are applied at the gates thereof are turned on while the other transistors 151-1b and 151-2a to 151-na are turned OFF.

Accordingly, when the output of the row decoder $RD_{ec}1$ goes LOW, the row driver RDr1 is operable and when one of the outputs of the row decoders $RD_{ec}2$ to $RD_{ec}n$ goes LOW, one of the corresponding row drivers RDr3 to RDr(n+1) is operable. As a result, when the fuse element FB2 is blown at the time when the internal row address signal $X_1$ is HIGH, the row driver RDr2 does not operate and either of the row line drive signals $\phi$WB1 and $\phi$WB2 alone goes HIGH so that one of the second word line group i.e. the word lines WLB1 to WLB(2n+2) except the word lines WLB3 and WLB4 can be activated. In other words, when a fuse element FBj is blown according to the first embodiment, both the word line WLB(2j−1) and the word line WLB2j which are activated by the row driver RDrj in a logical address are replaced by the word line WLB(2j+1) and WLB(2jj+2), respectively, which are activated by a row driver RDr(j+1) in a physical address.

As mentioned in detail above, it is possible to obtain a very flexible redundancy circuit according to the first embodiment of the present invention. Specifically, it is possible to remedy the defect which bridges two row drivers, namely, possible to remedy the short circuit between the word lines WLB2j and WLA(2i+1) by blowing the fuse element FA(i+1) of the first column of fuses 111 and the fuse element FBj of the second column of fuses 113.

Figure 6:
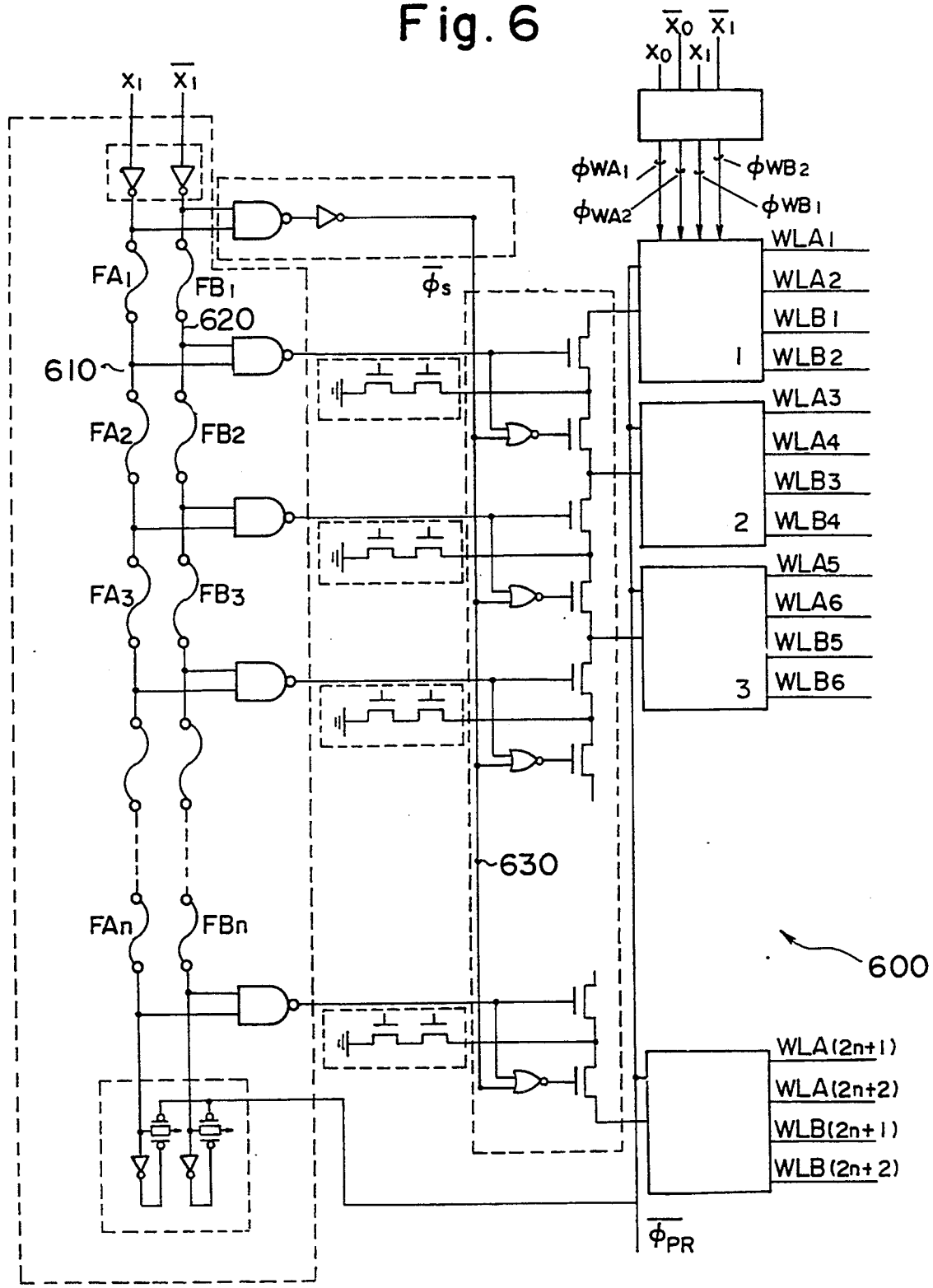
FIG. 6 is a circuit diagram of a second embodiment of the present invention.

A redundancy circuit of the semiconductor memory according to a second embodiment will be described with reference to FIG. 6.

The second embodiment is substantially the same as the first embodiment except for the absence of the delay circuit 140 of the first embodiment. A semiconductor device 600 includes a delay line 630 for applying a delay which is equivalent to the delay in the columns of fuses 610 and 620 to a switch activation signal $\overline{\phi_s}$ by using the material equivalent to the fuse elements.

Compared with the first embodiment, it is not necessary to provide the delay circuit 140 composed of the inverters, etc.

Figure 7:
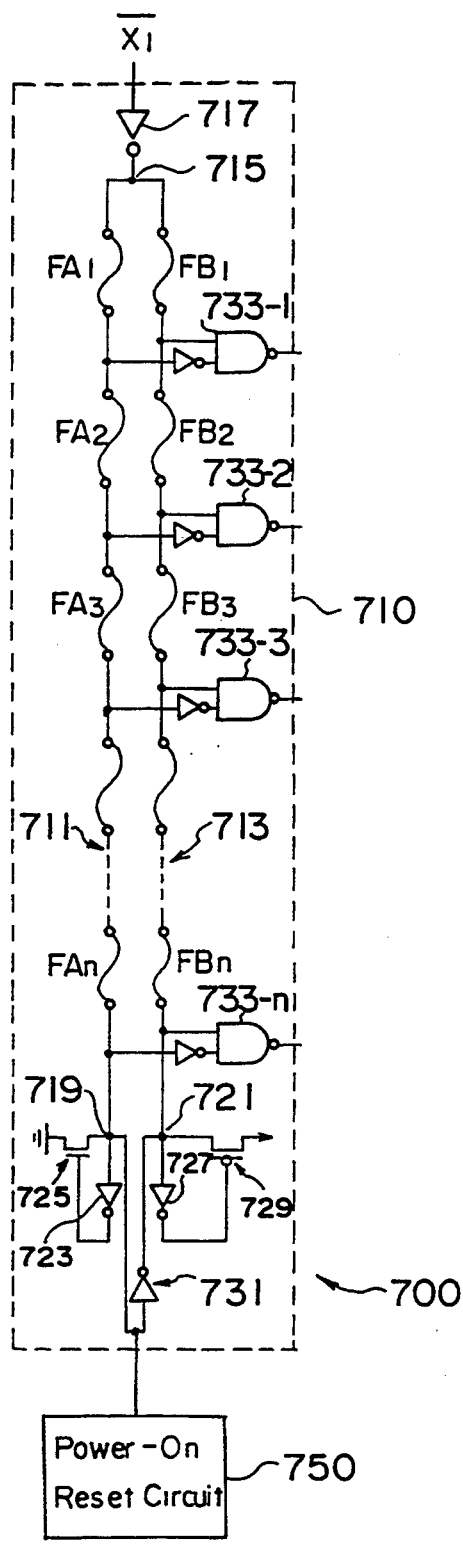
FIGS. 7 and 8 are views of first and second modifications of a defect decision circuit 110 in FIG. 1.

A first modification of the defect decision circuit 110 in FIG. 1 will be described with reference to FIG. 7.

A defect decision circuit 710 is a modification of the defect decision circuit 110 in FIG. 1 and comprises a first column of fuses 711 having a plurality of fuse elements FA1 to FAn and a second column of fuses 713 having a plurality of fuse elements FB1 to FBn.

One end of both the first and second columns of fuses 711 and 713 are commonly coupled to the output of an inverter 717 via a first node 715. The inverter 717 receives the internal row address signal $X_1$ at the input terminal thereof. The other ends of the first and second columns of fuses 711 and 713 include a second node 719 and a third node 721 respectively corresponding thereto.

The second node 719 is coupled to the input terminal of an inverter 723 and to the drain of an N-channel transistor 725 whose source is coupled to the ground (Vss). The output terminal of the inverter 723 is coupled to the gate of a transistor 725. The third node 721 is coupled to the input terminal of an inverter 727 and to the drain of a P-channel transistor 729 whose source is coupled to the power supply Vcc. The output terminal of the inverter 727 is coupled to the gate of the P-channel transistor 729.

The second node 719 and the third node 721 receive the output signal of a known power-on reset circuit 750. The power-on reset circuit 750 outputs a low level one-shot pulse immediately before receiving the internal row address signal $X_1$ after the power supply Vcc is applied to the semiconductor device 700. The third node 721 receives a high level one-shot pulse from the power-on reset circuit 750 via an inverter 731.

The defect decision circuit 710 having the arrangement set forth above receives the low level one-shot pulse from the power-on reset circuit 750 after the power supply Vcc of the semiconductor device 700 rises. The second node 719 goes LOW and the third node 721 goes HIGH in response to the low level one-shot pulse.

The potential level set by the power-on reset circuit 750 is held at the second and third nodes 719 and 721 by the inverters 723 and 727 and the transistors 725 and 729 respectively coupled to these nodes 719 and 721 until the internal row address signal $X_1$ is applied to the second and third nodes 719 and 721.

Since both the first and second columns of fuses 711 and 713 go LOW, upon reception of the high level internal row address signal $X_1$, supposing that the fuse elements are not blown, outputs of detection circuits 733-1 to 733n, having respective inverters whose input terminals are all coupled to the first column of fuses 111, all go HIGH. Supposing that the fuse FB2 is blown, the detection circuits 733-2 to 733-n output low level signals.

Since both the first and second columns of fuses 711 and 713 go HIGH, upon reception of the low level internal row address signal $X_1$, provided that the fuse elements are not blown, all the outputs of detection circuits go HIGH. Supposing the fuse FB3 is blown, the detection circuits 733-3 to 733-n output low level signals.

As mentioned above, the defect decision circuit 710 according to the first modification can perform the same operation as the defect decision circuit 110 in FIG. 1. However, the defect decision circuit 710 has the disadvantages that the number of inverters are increased and the power-on reset circuit is additionally required compared with the defect decision circuit 110 of FIG. 1.

Figure 8:
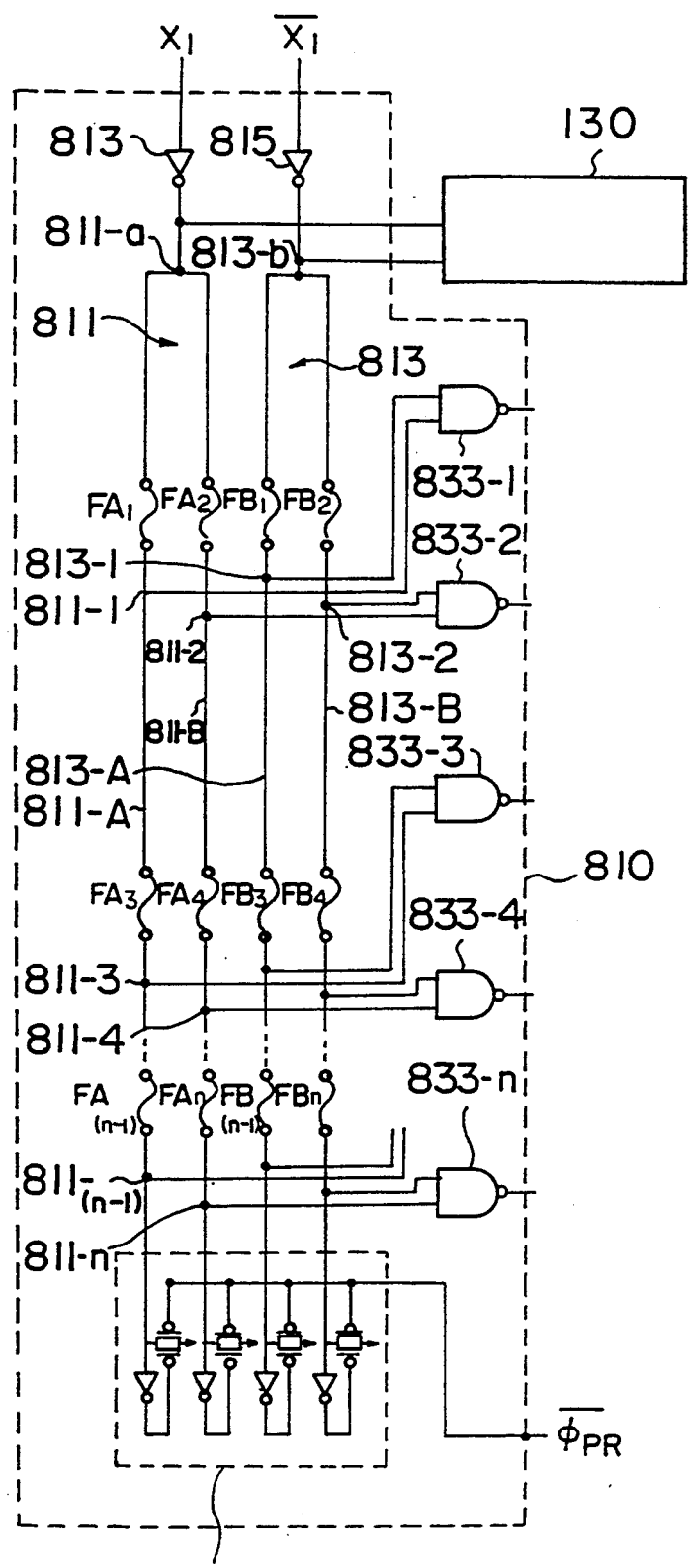

A second modification of the defect decision circuit 110 of FIG. 1 will be described with reference to FIG. 8.

A defect decision circuit 810 comprises a first group of fuses 811 comprising a first and second column of fuses 811-A and 811-B and a second group of fuses 813 comprising a first and second column of fuses 813-A and 813-B. The first column of fuses 811-A in the first group of fuses 811 includes fuses FA1, FA3, ... FA(n−1) and the second column of fuses 811-B in the same group of fuses 811 includes fuses FA2, FA4, ... FAn. The first column of fuses 813-A in the second group of fuses 813 includes fuses FB1, FB3, ... FB(n−1) and the second column of fuses 813-B in the same group of fuses 813 includes fuses FB2, FB4, ... FBn. The defect decision circuit 810 further comprises n first detection circuits 833-1, 833-2, ... 833-n. The input terminals of the first detection circuit 833-1 are coupled to a node 811-1 between the fuse FA1 and the fuse FA3 and to a node 813-1 between the fuse FB1 and the fuse FB3 to thereby detect whether the fuse FA1 or the fuse FB1 is blown. The input terminals of the second detection circuit 833-2 are coupled to a node 811-2 between the fuse FA2 and the fuse FA4 and to a node 813-2 between the fuse FB2 and the fuse FB4 to thereby detect whether the fuse FA2 or the fuse FB2 is blown. Likewise, the input terminals of the third to nth detection circuit 833-3 to 833-n are respectively coupled to the corresponding nodes.

The first and second columns of fuses 811-A and 811-B of the first group of fuses 811 are commonly coupled at one end to a node 811-a to which the internal row address signal $X_1$ is applied via an inverter 813. The first and second columns of fuses 813-A and 813-B of the second group of fuses 813 are commonly coupled at one end to a node 813-b to which the internal row address signal $X_1$ is applied via an inverter 815.

The nodes 811-a and 813-b are coupled to the second detection circuit 130 as explained in the first embodiment.

The other ends of the first and second group of fuses 811 and 813 are coupled to a fuse clamping circuit 820 which is controlled by a precharge signal $\overline{\phi_{PR}}$.

The operation of the defect decision circuit 810 according to the second modification is substantially the same as that of the first embodiment, hence the explanation thereof is omitted.

According to the second modification having the arrangement set forth above, the number of fuse elements included in each column of fuses 811-A, 811-B, 813-A and 813-B is reduced by half and the load capacity is decreased compared with the first embodiment, to thereby shorten the delay time necessary for driving these columns of fuses. Furthermore, since one fuse element may be provided in the pitch to which two first detection circuits are provided (i.e., the pitch where two decoders, not shown, are provided), the fuse pitch can be increased so that the fuses can be blown with ease (other fuses are prevented from being blown when one fuse is blown).

Figure 9:
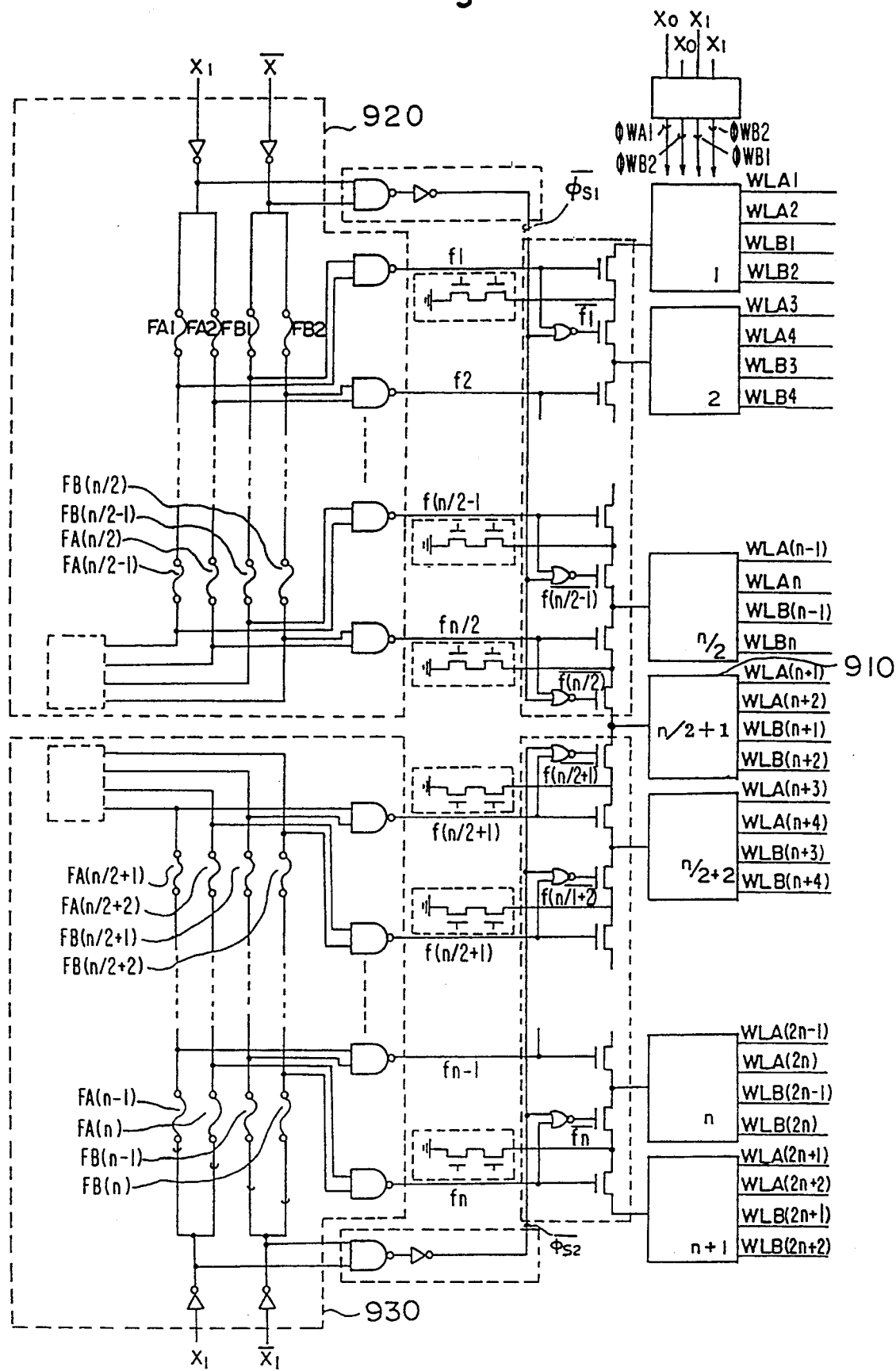
FIG. 9 is a circuit diagram of an applied example of a defect decision circuit 820 in FIG. 8.

An applied example of the second modification will be described with reference to FIG. 9.

According to the applied example, a redundancy row driver 910 is disposed at the central portion of the memory array whereby the redundancy function can be performed by first and second defect decision circuits 920 and 930.

According to this applied example, the parasitic resistance of each column of fuses can be reduced to a half and the number of fuse elements can be reduced to one fourth compared with those of the first embodiment.

A redundancy circuit of the semiconductor memory according to the third embodiment will be described with reference to FIG. 10.

A semiconductor memory device 1000 according to the third embodiment can replace a group of columns of defective memory cells by a group of columns of redundancy memory cells.

The memory cell array comprises in general four subarrays A, B, C, and D each of which can be activated by receiving subarray activation signals BS1, BS2, BS3 and BS4 respectively having power supply potential level (Vcc) from a subarray selection circuit 1001 according to embodiments employing a plurality of subarrays. The subarray selection circuit 1001 can be controlled by the internal row address signal set forth above. The subarray selection circuit 1001 controlled by the internal row address signals set forth above outputs the subarray activation signals BS1 to BS4 which are all low level (Vss) when the internal row address signals $X_j$, $\overline{X}_j$, $X_{j+1}$ and $\overline{X}_{j+1}$ received thereby are all at ground level (Vss) and enables only one of the subarray activation signals selected by the internal row address signal to be high level (Vcc) if any two signals among the internal row address signals $X_j$, $\overline{X}_j$, $X_{j+1}$ and $\overline{X}_{j+1}$ are at the power supply potential level. The subarray selection circuit 1001 may be composed of a circuit equivalent to the row line drive signal generator 300 as illustrated in FIG. 3.

The subarrays A to D are commonly coupled to (n+1) column lines CL1 to CL(n+1). The column CL(n+1) is a redundancy column line.

Since the subarrays A to D have the same arrangement, the subarray D is representative of the subarrays in the third embodiment in FIG. 10 and is described in detail below.

The column line CL1 is coupled to transfer gates 1011a, 1011b, 1011c and 1011d in a region of the subarray D. Each of the transfer gates 1011a to 1011d includes a pair of N-channel transistors having gates commonly coupled to the column line CL1 and is capable of coupling each pair of bit lines BL1A, BL1B, BL1C and BL1D with the corresponding data bus lines 1003. That is, when the column CL1 goes HIGH (Vcc level), all the transfer gates 1011a to 1011d are ON so that the potential level difference at each pair of the bit lines BL1A to BL1D is amplified by a known sense amplifier SA and appear on the corresponding data bus lines 1003. Each pair of the bit lines BL1A to BL1D is coupled to a plurality of memory cells as illustrated in FIG. 1 and each of the sense amplifiers SAs has the same arrangement although it is illustrated differently in some parts thereof in FIGS. 1 and 10.

Likewise, each of the column lines CL2 to CL(n+i) is coupled to four transfer gates to thereby control the coupling between the four pairs of bit lines and the data bus lines 1003.

A defect decision circuit 1020 of the semiconductor memory device 1000 includes four columns of fuses 1021, 1023, 1025 and 1027. Each of the four columns of fuses 1021, 1023, 1025 and 1027 is coupled at one end to the output of the inverters 1029, 1031, 1033 and 1035, respectively, of the columns of fuse drive circuits and coupled at the other end to a fuse clamping circuit 1040. The first column of fuses 1021 receives the subarray activation signal BS1 via the inverter 1029 at one end thereof and include a plurality of nodes 1021-1 to 1021-n and a plurality of fuses FA1 to FAn for coupling the output of the inverter 1029 to the nodes 1021-1 to 1021-n successively in series.

Likewise, the second, third and fourth columns of fuses 1023, 1025 and 1027 respectively receive the subarray activation signals BS2, BS3 and BS4 via the inverters 1031, 1033 and 1035 at each one end thereof and include a plurality of nodes 1023-1 to 1023-n, 1025-1 to 1025-n and 1027-1 to 1027-n and a plurality of fuses FB1 to FBn, FC1 to FCn and FD1 to FDn which couple these nodes successively in series. The columns of fuses 1021, 1023, 1025 and 1027 are coupled to clamping circuits 1041, 1043, 1045 and 1047 at the other end thereof respectively.

The clamping circuits 1041, 1043, 1045 and 1047 have substantially the same arrangement as the clamping circuits 121 and 123 of the first embodiment. However, the clamping circuits 1041, 1043, 1045 and 1047 in the third embodiment are reset by the subarray activation signals BS1, BS2, BS3 and BS4, respectively, although those in the first embodiment are reset by the precharge signal $\overline{\phi_{PR}}$.

The defect decision circuit 1020 includes NAND gates 1037-1 to 1037-n serving as n first detection circuits. The NAND gates 1037-1 to 1037-n each have four input terminals which are respectively coupled to corresponding nodes. For example, the input terminals of the NAND gate 1037-1 are coupled to the nodes 1021-1, 1023-1, 1025-1 and 1027-1. When all the nodes 1021-1, 1023-1, 1025-1 and 1027-1 coupled to the NAND gate 1027-1 are HIGH (Vcc), the NAND gate 1037-1 outputs a low level signal (Vss). When any one of these nodes is LOW, the NAND gate 1037-1 outputs a high level signal (Vcc). Likewise, input terminals of other NAND gates 1037-2 to 1037-n are coupled to corresponding nodes of the columns of fuses 1021, 1023, 1025 and 1027.

An arrangement of the column line selection circuit 1100 for receiving output signals of the NAND gates 1037-1 to 1037-$n$ will be described below.

The column line selection circuit 1100 is coupled to (n+1) column lines CL1 to CL(n+1) and includes n switching circuits 1101-1 to 1101-$n$ which are coupled between input terminals of columns of drivers 1201-k, 1201-(k+1) serving as inverters which are coupled to adjoining column lines CLk, CL(k+1) (k is an integer and $1 \leq k \leq n$). Each of the switching circuits 1101-1 to 1101-$n$ has the same arrangement. For example, the switching circuit 1101-1 includes first and second switches 1103 and 1105 respectively, each composed of an N-channel transistor and a P-channel transistor coupled in parallel with each other. First electrodes of both the transistors of the first switch 1103 are commonly coupled to the column line CL1 via the column driver 1201-1 and second electrodes of these transistors are commonly coupled to the node 1107. A gate of the N-channel transistor of the first switch 1103 is coupled to a gate of the P-channel transistor of the first switch 1103 is coupled to a gate of the N-channel transistor of the second switch 1105 via the node 1111. First electrodes of both the transistors of the second switch 1105 are commonly coupled to the node 1107 and second electrodes of these transistors are commonly coupled to the column line CL2 via the column driver 1201-2. An input terminal of the column driver 1201-1 is coupled to a power supply (Vcc) via a P-channel transistor having the gate coupled to the output terminal of the NAND gate 1037-1. The output terminal of the NAND gate 1037-1 is also coupled to the node 1109 and the input terminal of the inverter 1113. An output terminal of the inverter 1113 is coupled to the node 1111. An input terminal of the column driver 1201-2 is coupled to the power supply (Vcc) via a P-channel transistor having the gate coupled to the output terminal of the inverter 1113 and a P-channel transistor having the gate coupled to the output terminal of the NAND gate 1037-2.

According to the third embodiment, the node 1107 of the switching circuit 1101-1 is coupled to the output terminal of the known column decoder 1301-1. The column decoders 1301-1 to 1301-$n$ comprise NAND gates which receive a part of internal column address signals $Y_o, \overline{Y}_o \ldots Y_k, \overline{Y}_k$ which are operative in response to external address signals $A_o$ to $A_k$. The column decoders 1301-1 to 1301-$n$ output low level signals only when the input internal column address signals are all HIGH.

The arrangement of the switching circuits 1101-2 to 1101-$n$ of the column line switching circuit 1100 is substantially the same as that of the switching circuit 1101-1 except for a partial difference therebetween (the portion relating to the coupling of the power supply (Vcc) via the P-channel transistor coupled to the input terminal of the column driver 1201-1 in the switching circuit 1101-1). An input terminal of the column driver 1201-2 is coupled to the power supply (Vcc) via a P-channel transistor having the gate coupled to the output terminal of the inverter 1113 and a P-channel transistor having the gate coupled to the output terminal of the NAND gate 1037-2. For example, in the switching circuit 1101-2, the arrangement of the switching circuits 1101-3 to 1101-$n$ is the same as that of the switching circuit 1101-2.

Figure 10:
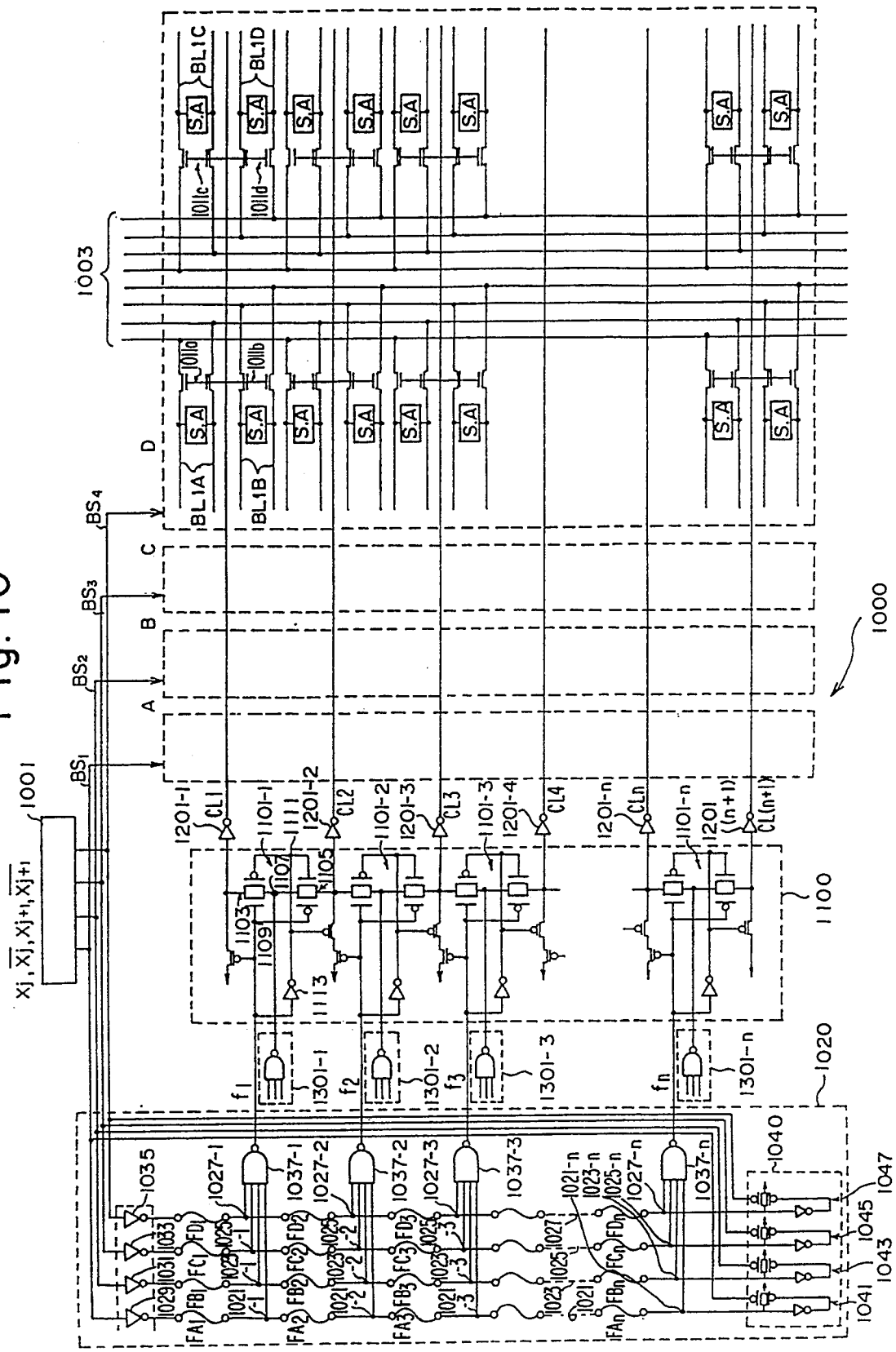
FIG. 10 is a circuit diagram of a third embodiment of the present invention.

An operation of the semiconductor memory device as illustrated in FIG. 10 will be described below in the case where the fuses FA1, FB2 and FC3 are blown.

If the subarray activation signals BS1, BS2, BS3 and BS4 are all LOW, the columns of fuses 1021, 1023, 1025 and 1027 receive high level signals from the inverters 1029, 1031, 1033 and 1035 respectively comprising a fuse column driver circuit, and also receive a high level signal from the fuse clamping circuit 1040 so that all the nodes 1021-1 to 1021-n of the columns of fuses go HIGH.

When the subarray activation signal BS1 goes HIGH, the output of the inverter 1029 goes LOW. However, since the fuse FA1 is blown and the clamping circuit 1041 clamps the columns of fuses 1021 at high level, all the nodes 1021-1 to 1027-$n$ remain HIGH. Consequently, since the NAND gates 1037-1 to 1037-$n$ output low level detection signals $f_1$ to $f_n$, each of the first switch of the switching circuits 1101-1 to 1101-$n$ turns OFF and each of the second switch thereof turns ON. Thereafter, when one of the column decoders 1301-1 to 1301-$n$ outputs a low level signal, only a column line CL(j+1) coupled to the column decoder 1301-j via the second switch and the column driver 1201-(j+1) goes HIGH. The column line CL1 remains LOW irrespective of the output of the column decoder since the P-channel transistor coupled to the input terminal of the driver 1201-1 is ON.

Whereupon, since the subarray A among the subarrays A to D receives the subarray activation signal BS1, it is active.

Accordingly, the defect decision circuit 1020 can replace physically the column line CL1 by another column line CL2 if the fuse FA1 is blown and the subarray activation signal BS1 is HIGH supposing that the column line CL1 is coupled to the defective memory cell or the defective bit line in the subarray A.

Successively, when the subarray activation signal BS2 alone goes HIGH, the output of the inverter 1031 goes LOW and the node 1023-1 also goes LOW.

Since the fuse FB2 is blown, other nodes 1023-2 to 1023-$n$ are kept HIGH by the clamping circuit 1043.

As a result, since the NAND gate 1037-1 outputs the high level detection signal $f_1$ and the NAND gates 1037-2 to 1037-n output the low level detection signals $f_2$ to $f_n$, respectively, the first switch of the switching circuit 1101-1 turns ON and the second switch thereof turns OFF while the first switches of the switching circuits 1101-2 to 1101-n turn OFF and the second switches thereof turn ON.

Accordingly, the defect decision circuit 1020 can replace physically the column line CL2 by another column line CL3 if the fuse FB2 is blown and the subarray activation signal BS2 is HIGH supposing that the column line CL2 is coupled to the defective memory cell or the defective bit line in the subarray B.

Successively, when the subarray activation signal BS3 alone goes HIGH, the output of the inverter 1033 goes LOW so that both the nodes 1025-1 and 1025-2 go LOW. Other nodes 1025-3 to 1025-$n$ remain HIGH since the fuse FC3 is blown. As a result, the defect decision circuit 1020 can replace physically the column line CL3 by another column line CL4 if the fuse FC3 is blown and the subarray activation signal BS3 is HIGH supposing that the column line CL3 is coupled to the defective memory cell or the defective bit line in the subarray C.

Furthermore, when the subarray activation signal BS4 alone goes HIGH, the output of the inverter 1035 goes LOW and all the fuses FD1 to FDn are conductive so that all the nodes 1027-1 to 1027-n go LOW and the clamping circuit 1047 is nonoperable.

As a result, all the AND circuits 1037-1 to 1037-n output the high level detection signals $f_1$ to $f_n$, respectively, so that first switches of all the switching circuits 1101-1 to 1101-n turn ON while the second switches thereof turn OFF.

Accordingly, the defect decision circuit 1020 can access the memory cell in the subarray D using column lines CL1 to CLn without using the redundancy column line CL(n+1) supposing that the fuses FD1 to FDn are all conductive and the subarray activation signal BS4 is HIGH.

As is evident from the detailed explanation of the third embodiment, each subarray can perform the redundancy scheme independently of each other.

Although the redundancy scheme is performed using column lines, it may be performed using a defect decision circuit 1020 by way of word lines. In the first embodiment, if the defect decision circuit 110 is replaced by the defect decision circuit 1020 of the third embodiment, the columns of fuses 1021, 1023, 1025 and 1027 may be provided for receiving the row drive signals $\phi WA1$, $\phi WA2$, $\phi WB1$ and $\phi WB2$ by way of the inverters 1029, 1031, 1033 and 1035. In this case, the redundancy scheme can be performed by each word line.

I claim:

1. A semiconductor memory device comprising:
   a main select line group having first and second select lines;
   a redundancy select line group having third and fourth select lines;
   a first select line activation circuit for activating one of the select lines in the main select line group in response to first and second control signals, the first select line activation circuit activating the first select line when the first control signal is at a first potential level and activating the second select line when the first control signal is at a second potential level;
   a second select line activation circuit for activating one of the select lines of the redundancy select line group in response to the first and second control signals, the second select line activation circuit activating the third select line when the first control signal is at the first potential level and activating the fourth select line when the first control signal is at the second potential level;
   a first conductive. line having a first terminal to receive one of the first control signal and a supply signal having substantially the same potential level as the first control signal, a first node coupled to the first terminal and a first conductive portion connected between the first terminal and the first node;
   a first potential supply circuit for causing the first node to be at substantially the same potential level as that of one of the first and second potential levels when the first conductive portion is blown;
   a second conductive line having a second terminal to receive a third control signal, complementary to the first control signal, a second node coupled to the second terminal and a second conductive portion connected between the second terminal and the second node;
   a second potential supply circuit for causing the second node to be at substantially the same potential level as that of one of the first and second potential levels when the second conductive portion is blown; and
   a control signal generating circuit for outputting the second control signal to the second select line activation circuit when the potential level at the first node and the potential level at the second node have a given relation with respect to each other, and outputting the second control signal to the first select line activation circuit when said given relation does not exist.

2. A semiconductor memory device according to claim 1,
   wherein the first potential supply circuit has a first potential holding circuit for causing the first node to be substantially at one of the first and second potential levels when the first conductive portion is blown; and
   wherein the second potential supply circuit has a second potential holding circuit for causing the second node to be substantially at one of the first and second potential levels when the second conductive portion is blown.

3. A semiconductor memory device according to claim 2, wherein the given relation is that both the first and second nodes are at one of the first and second potential levels.

4. A semiconductor memory device according to claim 2,
   wherein the first select line activation circuit is responsive to a third control signal;
   wherein the first select line is coupled to the first control signal and the second select line is coupled to the third control signal;
   wherein the second select line activation circuit is responsive to the third control signal;
   wherein the third select line is coupled to the first control signal and the fourth select line is coupled to the third control signal; and
   wherein the second and fourth select lines are activated when the third control signal is substantially at the first potential level.

5. A semiconductor memory device according to claim 4, wherein the given relation is that both the first and second nodes are at the first potential level.

6. A semiconductor memory device according to claim 4,
   wherein each of the first to fourth select lines includes a plurality of word lines;
   wherein the first select line activation circuit is responsive to fourth control signal to thereby cause one word line among the first and second select lines to be active; and
   wherein the second select line activation circuit is responsive to the fourth control signal to thereby cause one word line among the third and fourth select lines to be active.

7. A semiconductor memory device according to claim 6, wherein each of the first to fourth select lines is activated when one of the word lines belonging to each of the first to fourth select lines is active.

8. A semiconductor memory device according to claim 1,
   wherein each of the first to fourth select lines has a plurality of word lines;
   wherein the first select line activation circuit is responsive to fourth control signal to thereby cause one word line among the first and second select lines to be active; and wherein the second select line activation circuit is responsive to a fourth control signal to thereby cause one word line among the third and fourth select lines to be active.

9. A semiconductor memory device according to claim 8, wherein each of the first to fourth select lines is activated when one of the word lines belonging to each of the first to fourth select lines is active.

10. A semiconductor memory device according to claim 1, wherein the given relation is that the first node is at the first potential level and the second node is at the second potential level.

11. A semiconductor memory device comprising:
a main select line group having first and second select lines;
a redundancy select line group having third and fourth select lines;
a first select line activation circuit for activating one of the select lines in the main select line group in response to first and second control signals, the first select line activation circuit activating the first select line when the first control signal is at a first potential level and activating the second select line when the first control signal is at a second potential level;
a second select line activation circuit for activating one of the select lines in the redundancy select line group in response to the first and second control signals, the second select line activation circuit activating the third select line when the first control signal is at the first potential level and activating the fourth select line when the first control signal is at the second potential level;
a first conductive line having a first terminal to receive the first control signal, a first node coupled to the first terminal and a first conductive portion connected between the first terminal and the first node;
a first potential supply circuit for causing the first node to be at substantially the same potential level as that of one of the first and second potential levels when the first conductive portion is blown;
a second conductive line having a second terminal to receive one of the first control signal and a supply control signal which is substantially equivalent to the first control signal, a second node coupled to the second terminal and a second conductive portion connected between the second terminal and the second node;
a second potential supply circuit for causing the second node to be at substantially the same potential level as one of the first and second potential levels when the second conductive portion is blown; and
a control signal generating circuit for outputting the second control signal to the second select line activation circuit when the first node and the second node have a given relation with respect to each other and outputting the second control signal to the first select line activation circuit when said given relation does not exist.

12. A semiconductor memory device according to claim 11,
wherein the first potential supply circuit has a first potential holding circuit for causing the first node to be substantially at one of the first and second potential levels when the first conductive portion is blown; and wherein the second potential supply circuit has a second potential holding circuit for causing the second node to be substantially at the other one of the first and second potential levels when the second conductive portion is blown.

13. A semiconductor memory device according to claim 12,
wherein the first select line activation circuit is further responsive to a third control signal;
wherein the first select line is coupled to the first control signal and the second select line is coupled to the third control signal;
wherein the second select line activation circuit is further responsive to the third control signal;
wherein the third select line is coupled to the first control signal and the fourth select line is coupled to the third control signal; and
wherein the second and fourth select lines are active when the third control signal is substantially at the first potential level.

14. A semiconductor memory device according to claim 13, wherein the given relation is that the first node is at the first potential level and the second node is at the second potential level.

15. A semiconductor memory device according to claim 13,
wherein each of the first to fourth select lines includes a plurality of word lines;
wherein the first select line activation circuit is responsive to a fourth control signal to thereby cause one word line among the first and second select lines to be active; and
wherein the second select line activation circuit is responsive to the fourth control signal to thereby cause one word line among the third and fourth select lines to be active.

16. A semiconductor memory device according to claim 15, wherein each of the first to fourth select lines is activated when one of the word lines belonging to each of the first to fourth select lines is active.

17. A semiconductor memory device according to claim 11,
wherein each of the first to fourth select lines has a plurality of word lines;
wherein the first select line activation circuit is responsive to a fourth control signal to thereby cause one word line among the first and second select lines to be active; and
wherein the second select line activation circuit is responsive to the fourth control signal to thereby cause one word line among the third and fourth select lines to be active.

18. A semiconductor memory device according to claim 17, wherein each of the first to fourth select lines is activated when one of the word lines belonging to each of the first to fourth select lines is active.

19. A semiconductor memory device comprising:
a main select line group and a redundancy select line group, each having a plurality of select lines;
a first select line activation circuit for activating one of the select lines in the main select line group in response to a plurality of address control signals including a second control signal;
a second select line activation circuit for activating one of the select lines in the redundancy select line group in response to the address control signals including the second control signal;

a first conductive line having a first terminal to receive one of a first control signal included in the address control signals and a supply signal substantially equivalent to the first control signal, a first node coupled to the first terminal and a first conductive portion connected between the first terminal and the first node;

a first potential supply circuit for causing the first node to be at substantially one of first and second potential levels when the first conductive portion is blown;

a second conductive line having a second terminal to receive a third control signal complementary to the first control signal, a second node coupled to the second terminal and a second conductive portion connected between the second terminal and the second node;

a second potential supply circuit for causing the second node to be at substantially one of the first and second potential levels when the second conductive portion is blown; and a control circuit for outputting the second control signal to the second select line activation circuit when the potential level at the first node and the potential level at the second node have a given relation with respect to each other, and outputting the second control signal to the first select line activation circuit when said given relation does not exist.

20. A semiconductor memory device according to claim 19, wherein the first potential supply circuit has a first potential holding circuit for causing the first node to be substantially at one of the first and second potential levels when the first conductive portion is blown, and wherein the second potential supply circuit has a second potential holding circuit for causing the second node to be substantially at one of the first and second potential levels when the second conductive portion is blown.

21. A semiconductor memory device according to claim 20, wherein the given relation is that both the first and the second nodes are at one of the first and the second potential levels.

22. A semiconductor memory device according to claim 19, wherein the first and second conductive portions are fuse elements.

23. A semiconductor memory device according to claim 22, wherein the first potential supply circuit has a first potential holding circuit for causing the first node to be substantially at one of the first and second potential levels when the first conductive portion is blown, and wherein the second potential supply circuit has a second potential holding circuit for causing the second node to be substantially at one of the first and second potential levels when the second conductive portion is blown.

24. A semiconductor memory device according to claim 23, wherein the given relation is that both the first and second nodes are at one of the first and the second potential levels.

25. A semiconductor memory device according to claim 19, wherein the plurality of address control signals each are substantially at one of the first potential level and the second potential level.

26. A semiconductor memory device comprising:

a main select line group and a redundancy select line group, each having a plurality of select lines;

a first select line activation circuit for activating one of the select lines in the main select line group in response to a plurality of address control signals including a second control signal;

a second select line activation circuit for activating one of the select lines in the redundancy select line group in response to the address control signals including the second control signal;

a first conductive line having a first terminal to receive one of a first control signal included in the address control signals and a reference signal substantially equivalent to the first control signal, a first node coupled to the first terminal and a first conductive portion connected between the first terminal and the first node;

a first potential supply circuit for causing the first node to be at substantially one of first and second potential level when the first conductive portion is blown;

a second conductive line having a second terminal to receive one of said first control signals and a supply signal substantially equivalent to the first control signal, a second node coupled to the second terminal and a second conductive portion connecting between the second terminal and the second node;

a second potential supply circuit for causing the second node to be at substantially one of the first and second potential levels when the second conductive portion is blown; and a control circuit for outputting the second control signal to the second select line activation circuit when the potential level at the first node and the potential level at the second node have a given relation to each other, and outputting the second control signal to the first select line activation circuit when said given relation does not exist.

27. A semiconductor memory device according to claim 26, wherein the first potential supply circuit has a first potential holding circuit for causing the first node to be substantially at one of the first and second potential levels when the first conductive portion is blown, and wherein the second potential supply circuit has a second potential holding circuit for causing the second node to be substantially at the other one of the first and second potential levels when the second conductive portion is blown.

28. A semiconductor memory device according to claim 27, wherein the given relation is that the first node is at one of the potential levels and the second node is at the other potential level.

29. A semiconductor memory device according to claim 26, wherein the first and second conductive portions are fuse elements.

30. A semiconductor memory device according to claim 26, wherein the plurality of address control signals each are substantially at one of the first and second potential levels.

31. A semiconductor memory device comprising:

a first conductive line having a first terminal, a first node and a first conductive portion connecting between the first terminal and the first node;

a first potential supply circuit for causing the first node to be at a first potential level when the first conductive portion is blown;

a second conductive line having a second terminal, a second node and a second conductive portion connecting between the second terminal and the second node;

a second potential supply circuit for causing the second node to be at a further potential level having a first given potential relation to the first potential level when the second conductive portion is blown;

a drive circuit for driving the first and second terminals at potential levels having a second given potential relation; and a detecting circuit for detecting whether a given potential relation between the first and second nodes is either the first given potential relation or the second given potential relation.

32. A semiconductor memory device according to claim 31, wherein the first given potential relation is that both the first and second nodes are substantially at the first potential level, and the second given potential relation is that the second terminal is substantially at a second potential level when the first terminal is substantially at the first potential level, and the first terminal is substantially at the second potential level when the second terminal is substantially at the first potential level.

33. A semiconductor memory device according to claim 31, wherein the first given potential relation is that the second node is substantially at a second potential level when the first node is substantially at the first potential level, and wherein the second given potential relation is that both the first and second terminals are substantially at the same potential level.

34. A semiconductor memory device according to claim 31, further comprising a main memory cell group having a plurality of memory cells and a redundancy memory cell group having a plurality of memory cells, wherein the redundancy memory cell group is accessible when the detecting circuit detects the first given potential relation and the main memory cell group is accessible when the detecting circuit detects the second given potential relation.

35. A semiconductor memory device according to claim 34, wherein the main memory cell group has a first main memory cell group having a plurality of memory cells and a second main memory cell group having a plurality of memory cells;

wherein the second given potential relation has first and second states;

wherein the first main memory cell group is accessible when the detecting circuit detects the second given potential relation at the first state; and wherein the second main memory cell group is accessible when the detecting circuit detects the second given potential relation at the second state.

36. A semiconductor memory device according to claim 35, wherein the redundancy memory cell group comprises a first redundancy memory cell group having a plurality of memory cells and a second redundancy memory cell group having a plurality of memory cells;

wherein the first redundancy memory cell group is accessible when the detecting circuit detects the first given potential relation if the second given potential relation is at the first state; and wherein the second redundancy memory cell group is accessible when the detecting circuit detects the first given potential relation if the second given potential relation is at the second state.

37. A semiconductor memory device according to claim 36, wherein the first main memory cell group is coupled to a first select line, wherein the second main memory cell group is coupled to a second select line;

wherein the first redundancy memory cell group is coupled to a third select line;

wherein the second redundancy memory cell group is coupled to a fourth select line;

wherein the first select line and the second select line are coupled to a first select line activation circuit;

wherein the third select line and the fourth select line are coupled to a second select line activation circuit ;

wherein the first select line activation circuit is responsive to a first control signal for thereby activating the first select line when the first control signal is at the first potential level and activating the second select line when the first control signal is at a second potential level;

wherein the second select line activation circuit is responsive to the first control signal for thereby activating the third select line when the first control signal is at the first potential level and activating the fourth select line when the first control signal is at the second potential level;

wherein the drive circuit outputs the first control signal; and wherein the first terminal receives either the first control signal or a signal representing a potential level substantially the same as that of the first control signal from the drive circuit.

38. A semiconductor memory device according to claim 37, wherein the first select line activation circuit is responsive to a second control signal and the first control signal to thereby activate one of the first and second select lines;

wherein the second select line activation circuit is responsive to the second control signal and the first control signal to thereby activate one of the third and fourth select lines;

wherein the detecting circuit applies the second control signal to the second select line activation circuit when the detecting circuit detects the first given potential relation; and wherein the detecting circuit applies the second control signal to the first select line activation circuit when the detecting circuit detects the second given potential relation.

39. A semiconductor memory device according to claim 38, wherein the first given potential relation is that both the first and second nodes are substantially at the first potential level, and the second given potential relation is that the second terminal is substantially at the second potential level when the first terminal is substantially at the first potential level, and the first terminal is substantially at the second potential level when the second terminal is substantially at the first potential level when the second terminal is substantially at the first potential level.

40. A semiconductor memory device according to claim 38, wherein the first given potential relation is that the second node is substantially at the first potential level when the first node is substantially at the first potential level; and wherein the second given potential relation is that both the first and second terminals are at substantially the same potential level.

41. A semiconductor memory device according to claim 38, wherein the first and second conductive portions are fuse elements.

42. A semiconductor memory device according to claim 38, wherein the first and second control signals are address signals.

43. A semiconductor memory device according to claim 38,
wherein each of the first to fourth select lines includes a plurality of word lines;
wherein the first select line activation circuit is responsive to the third control signal to thereby activate one word line among the first and second select lines; and
wherein the second select line activation circuit is responsive to the third control signal to thereby activate one word line among the third and fourth select lines.

44. A semiconductor memory device according to claim 43, wherein each of the first to fourth select lines is activated when one of the word lines among the first to fourth select lines belonging thereto is active.

45. A semiconductor memory device according to claim 36, wherein a plurality of memory cells belong to a memory cell array having first and second subarrays.

46. A semiconductor memory device according to claim 45,
wherein the first main memory cell group and the first redundancy memory cell group belong to the first subarray; and
wherein the second main memory cell group and the second redundancy memory cell group belong to the second subarray.

47. A semiconductor memory device according to claim 45,
wherein the drive circuit is a subarray selecting circuit for outputting first and second control signals.

48. A semiconductor memory device according to claim 47,
wherein the first subarray receives the first control signal and is accessible when the first control signal is substantially at the first potential level and is unaccessible when the first control signal is substantially at a second potential level;
wherein the second subarray receives the second control signal and is accessible when the second control signal is substantially at the first potential level and is unaccessible when the second control signal is substantially at the second potential level; and
wherein the subarray selecting circuit outputs the second control signal substantially at the second potential level when the first control signal is substantially at the first potential level, and outputs the first control signal substantially at the second potential level when the second control signal is substantially at the first potential level.

49. A semiconductor memory device according to claim 48, wherein the drive circuit applies the first control signal to the first terminal and applies the second control signal to the second terminal.

50. A semiconductor memory device according to claim 49,
wherein the first given potential relation is that the first and second nodes are substantially at the same potential level, and
wherein the second given potential relation is that the second terminal is substantially at the second potential level when the first terminal is substantially at the first potential level, and the first terminal is substantially at the second potential level when the second terminal is substantially at the first potential level.

51. A semiconductor memory device according to claim 48, further comprising first and second column lines, both coupled to the first and second subarrays,
wherein the first column line is coupled to the first and second main memory cell groups and is active upon reception of a third control signal; and
wherein the second column line is coupled to the first and second redundancy memory cell groups and is active upon reception of the third control signal.

52. A semiconductor memory device according to claim 51, wherein the detecting circuit applies the third control signal to the first column line when the detecting circuit detects the second given potential relation and applies the third control signal to the second column line when the detecting circuit detects the second given potential relation.

53. A semiconductor memory device according to claim 52, wherein the first state corresponds to a state where the first control signal is at the first potential level and the second state corresponds to a state where the second control signal is at the first potential level.

54. A semiconductor memory device according to claim 53, wherein the drive circuit applies the first control signal to the first terminal and applies the second control signal to the second terminal.

55. A semiconductor memory device according to claim 54,
wherein the first given potential relation is that the second node is substantially at the same potential level, and
wherein the second given potential relation is that the second terminal is substantially at the second potential level when the first terminal is substantially at the first potential level and the first terminal is substantially at the second potential level when the second terminal is substantially at the first potential level.

56. A semiconductor memory device comprising:
a first conductive line having a first terminal, a first node and a first conductive portion connecting between the first terminal and the first node;
a first potential supply circuit for causing the first node to be at a first potential level when the first conductive portion is blown;
a second conductive line having a second terminal, a second node and a second conductive portion connecting between the second terminal and the second node;
a second potential supply circuit for causing the second node to be at the first potential level and at a further potential level having a first given potential relation to the first potential level when the second conductive portion is blown;
a drive circuit for driving the first terminal and the second terminal at potential levels having a second given potential relation and outputting a first control signal;

first and second controlled circuits being responsive to a second control signal and the first control signal; and a first detecting circuit for detecting whether a given potential relation between the first and second nodes is the first given potential relation or the second given potential relation, wherein the first detecting circuit applies the second control signal to the second controlled circuit when it detects the first given potential relation, and applies the second control signal to the first controlled circuit when it detects the second given potential relation.

57. A semiconductor memory device according to claim 56, wherein the first given potential relation is that both the first and second nodes are substantially at the first potential level, and the second given potential relation is that the second terminal is substantially at a second potential level when the first terminal is substantially at the first potential level, and the first terminal is substantially at the second potential level when the second terminal is substantially at the first potential level.

58. A semiconductor memory device according to claim 56,
wherein the first given potential relation is that the second node is substantially at the second potential level when the first node is substantially at the first potential level; and
wherein the second given potential relation is that both the first and second terminals are substantially at the same potential level.

59. A semiconductor memory device according to claim 56, further comprising a main memory cell group having a plurality of memory cells and a redundancy memory cell group having a plurality of memory cells, wherein the redundancy memory cell group is accessible when the first detecting circuit detects the first given potential relation and the main memory cell group is accessible when the detecting circuit detects the second given potential relation.

60. A semiconductor memory device according to claim 59,
wherein the main memory cell group has a first main memory cell group having a plurality of memory cells and a second main memory cell group having a plurality of memory cells;
wherein the second given potential relation has first and second states;
wherein the first main memory cell group is accessible when the detecting circuit detects the second given potential relation if the second given potential relation is at the first state; and
wherein the second main memory cell group is accessible when the detecting circuit detects the second given potential relation if the second given potential relation is at the second state.

61. A semiconductor memory device according to claim 60,
wherein the redundancy memory cell group has a first redundancy memory cell group having a plurality of memory cells and a second redundancy memory cell group having a plurality of memory cells;
wherein the first redundancy memory cell group is accessible when the detecting circuit detects the first given potential relation if the second given potential relation is at the first state; and
wherein the second redundancy memory cell group is accessible when the detecting circuit detected the first given potential relation if the second given potential relation is at the second state.

62. A semiconductor memory device according to claim 61,
wherein the first main memory cell group is coupled to a first select line;
wherein the second main memory cell group is coupled to a second select line;
wherein the first redundancy memory cell group is coupled to a third select line;
wherein the second redundancy memory cell group is coupled to a fourth select line;
wherein the first select line and the second select line are coupled to the first controlled circuit;
wherein the third select line and the fourth select line are coupled to the second controlled circuit;
wherein the first controlled circuit is responsive to the first control signal for thereby activating the first select line when the first control signal is at the first potential level and activating the second select line when the first control signal is at a second potential level;
wherein the second controlled circuit is responsive to the first control signal for thereby activating the third select line when the first control signal is at the first potential level and activating the fourth select line when the first control signal is at the second potential level;
wherein the drive circuit outputs the first control signal; and
wherein the first terminal receives the first control signal or a signal representing the potential level substantially the same as that of the first control signal from the drive means.

63. A semiconductor memory device according to claim 62,
wherein the first controlled circuit activates one of the first and second select lines in response to the second control signal and the first control signal; and
wherein the second controlled circuit activates one of the third and fourth select lines in response to the second control signal and the first control signal.

64. A semiconductor memory device according to claim 63, wherein the first controlled circuit corresponds to a first select line activation circuit and the second controlled circuit corresponds to a second select line activation circuit.

65. A semiconductor memory device according to claim 64,
wherein the first given potential relation is that both the first and second nodes are at the first potential level; and
wherein the second given potential relation is that the second terminal is substantially at the second potential level when the first terminal is substantially at the first potential level, and the first terminal is substantially at the second potential level when the second terminal is substantially at the first potential level.

66. A semiconductor memory device according to claim 64,
wherein the first given potential relation is that the second node is substantially at the second potential level when the first node is substantially at the first potential level; and wherein the second given potential relation is that both the first and second terminals are at substantially the same potential level.

67. A semiconductor memory device according to claim 64, wherein the first and second conductive portions are fuse elements.

68. A semiconductor memory device according to claim 64, wherein the first and second control signals are address signals.

69. A semiconductor memory device according to claim 64, wherein each of the first to fourth select lines includes a plurality of word lines;

wherein the first select line activation circuit receives the third control signal to thereby cause one word line among the first and second select lines to be active; and wherein the second select line activation circuit receives the third control signal to thereby cause one word line among the third and fourth select lines to be active.

70. A semiconductor memory device according to claim 69, wherein each of the first to fourth select lines is activated when one of the word lines belonging thereto is active.

71. A semiconductor memory device according to claim 56, wherein the first terminal receives one of the first control signal and a signal synchronous with the first control signal;

wherein the first control signal is changed from the first potential level to a second potential level or is changed from the second potential level to the first potential level; and wherein the second terminal receives a third control signal having the second given potential relation to the first control signal.

72. A semiconductor memory device according to claim 71, further including a second detecting circuit coupled to the first and second terminals for detecting that one of the first control signal and the signal synchronous with the first control signal have the given potential relation to the third control signal;

wherein the second detecting circuit applies a fourth control signal to the first detecting circuit after the lapse of a first given time from a time of detection; and wherein the first detecting circuit applies the second control signal to the second controlled circuit on reception of the fourth control signal.

73. A semiconductor memory device according to claim 72, wherein the first node receives the first control signal after the lapse of a second given time from a time that the first terminal received the first control signal if the first conductive portion is blown; and wherein the first given time is longer than the second given time.

74. A semiconductor memory device according to claim 73, wherein the second detecting circuit includes a delay circuit; and wherein the first given time is set by the delay circuit.

75. A semiconductor memory device according to claim 74, wherein the first given potential relation is that both the first and second nodes are substantially at the first potential level, and the second given potential relation is that the second terminal is substantially at the second potential level when the first terminal is substantially at the first potential level, and the first terminal is substantially at the second potential level when the second terminal is substantially at the first potential level.

76. A semiconductor memory device according to claim 71, wherein the first terminal receives the first control signal through a first inverter circuit;

wherein the second terminal receives the third control signal through a second inverter circuit; and wherein the drive circuit outputs the first and third control signals having the second given potential relation to each other during an operating time and outputs the first and third control signals, both at the second potential level during a non-operating time.

77. A semiconductor memory device according to claim 76, wherein the first and second potential supply circuit cause the first and second nodes to be at the first potential level during the non-operating time.

78. A semiconductor memory device according to claim 77, further including a second detecting circuit coupled to the first and second terminals for detecting that one of the first control signal and the signal synchronous with the first control signal, and the third control signal have the second given potential relation;

wherein the second detecting circuit applies a fourth control signal to the first detecting circuit after the lapse of a first given time from a time of detection; and wherein the first detecting circuit applies the second control signal to the second controlled circuit after receiving the fourth control signal.

79. A semiconductor memory device according to claim 78, wherein the first node receives the first control signal at the lapse of a second given time from a time that the first terminal received the first control signal if the first conductive portion is blown; and wherein the first given time is longer than the second given time.

80. A semiconductor memory device according to claim 79, wherein the second detecting circuit includes a delay circuit; and wherein the first given time is set by the delay circuit.

81. A semiconductor memory device according to claim 80, wherein the first given potential relation is that both the first and second nodes are substantially at the first potential level, and the second given potential relation is that the second terminal is substantially at the second potential level when the first terminal is substantially at the first potential level, and the first terminal is substantially at the second potential level when the second terminal is substantially at the first potential level.

82. A semiconductor memory device comprising;

a first conductive line having a first terminal, first and third nodes, a first conductive portion connecting between the first terminal and the first node and a third conductive portion connecting between the first and the third nodes;

a first potential supply circuit for causing the first and third nodes to be at a first potential level when the first conductive portion is blown and causing the third node to be at the first potential level when the third conductive portion is blown;

a second conductive line having a second terminal and second and fourth nodes, a second conductive portion connecting between the second terminal and the second node and a fourth conductive portion connecting between the second and the fourth nodes;

a second potential supply circuit for causing the second and fourth nodes to be at the first potential level and at a further potential level having a first given potential relation to the first potential level when the second conductive portion is blown, and causing the fourth node to be at the first potential level and at the further potential level having the first given potential relation to the first potential level when the fourth conductive portion is blown;

a drive circuit for driving the first terminal and the second terminal at potential levels having a second given potential relation and for outputting a first control signal;

first, second and third controlled circuits being responsive to a second control signal and the first control signal;

a first detecting circuit for detecting whether a given potential relation between the first and second nodes is the first given potential relation or the second given potential relation, wherein the first detecting circuit applies the second control signal to the second controlled circuit when the first detecting circuit detects the first given potential relation and applies the second control signal to the first controlled circuit when the first detecting circuit detects the second given potential relation; and a third detecting circuit for detecting whether a further given potential relation between the third and forth nodes is the first given potential relation or the second given potential relation, wherein the third detecting circuit applies the second control signal to the third controlled circuit when the third detecting circuit detects the first given potential relation and applies the second control signal to the second controlled circuit when the third detecting circuit detects the second given potential relation.

83. A semiconductor memory device according to claim 82,
wherein the first given potential relation is that both the first and second nodes are substantially at the first potential level; and
wherein the second given potential relation is that the second terminal is substantially at a second potential level when the first terminal is substantially at the first potential level, and the first terminal is substantially at the second potential level when the second terminal is substantially at the first potential level.

84. A semiconductor memory device according to claim 82,
wherein the first given potential relation is that when one of the first and second nodes is substantially at the first potential level, one of the third and fourth nodes is substantially at the second potential level, respectively; and
wherein the second given potential relation is that both the first and second terminals are substantially at the same potential level.

85. A semiconductor memory device according to claim 82, further comprising first and second main memory cell groups, both having a plurality of memory cells, and a redundancy memory cell group having a plurality of memory cells;
wherein the second main memory cell group is accessible when the first detecting circuit detects the first given potential relation and the first main memory cell group is accessible when the first detecting circuit detects the second given potential relation; and
wherein the redundancy memory cell group is accessible when the third detecting circuit detects the first given potential relation, and the second main memory cell group is accessible when the third detecting circuit detects the second given potential relation.

86. A semiconductor memory device according to claim 85,
wherein the first main memory cell group has a first main memory cell subgroup having a plurality of memory cells and a second main memory cell subgroup having a plurality of memory cells;
wherein the second main memory cell group has a third main memory cell subgroup having a plurality of memory cells and a fourth main memory cell subgroup having a plurality of memory cells;
wherein the second given potential relation has first and second states;
wherein the first main memory cell subgroup is accessible when the first detecting circuit detects the second given potential relation and the third main memory cell subgroup is accessible when the third detecting circuit detects the second given potential relation if the second given potential relation is at the first state; and
wherein the second main memory cell subgroup is accessible when the first detecting circuit detects the second given potential relation and the fourth main memory cell subgroup is accessible when the third detecting circuit detects the second given potential relation if the second given potential relation is at the second state.

87. A semiconductor memory device according to claim 86,
wherein the redundancy memory cell group has a first redundancy memory cell subgroup having a plurality of memory cells and a second redundancy memory cell subgroup having a plurality of memory cells;
wherein the third main memory cell subgroup is accessible when the first detecting circuit detects the first given potential relation and the first redundancy memory cell subgroup is accessible when the third detecting circuit detects the first given potential relation if the second given potential relation is at the first state; and
wherein the fourth main memory cell subgroup is accessible when the first detecting circuit detects the first given potential relation and the second redundancy memory cell subgroup is accessible when the third detecting circuit detects the first given potential relation if the second given potential relation is at the second state.

88. A semiconductor memory device according to claim 87,
wherein the first main memory cell subgroup is coupled to a first select line;
wherein the second main memory cell subgroup is coupled to a second select line;

wherein the third main memory cell subgroup is coupled to a third select line;

wherein the fourth main memory cell subgroup is coupled to a fourth select line;

wherein the first redundancy memory cell subgroup is coupled to a fifth select line;

wherein the second redundancy memory cell subgroup is coupled to a sixth select line;

wherein the first select line and the second select line are coupled to the first controlled circuit;

wherein the third select line and the fourth select line are coupled to the second controlled circuit;

wherein the fifth select line and the sixth select line are coupled to the third controlled circuit;

wherein the first controlled circuit is responsive to the first control signal for activating the first select line when the first control signal is at the first potential level and activating the second select line when the first control signal is at the second potential level;

wherein the second controlled circuit is responsive to the first control signal for activating the third select line when the first control signal is at the first potential level and activating the fourth select line when the first control signal is at the second potential level;

wherein the third controlled circuit is responsive to the first control signal for activating the fifth select line when the first control signal is at the first potential level and activating the sixth select line when the first control signal is at the second potential level;

wherein the drive circuit outputs the first control signal; and wherein the first terminal receives one of the first control signal and a signal representing the potential level substantially the same as that of the first control signal from the drive circuit.

89. A semiconductor memory device according to claim 88, wherein the first controlled circuit activates one of the first and second select lines in response to the second control signal and the first control signal;

wherein the second controlled circuit activates one of the third and fourth select lines in response to the second control signal and the first control signal; and wherein the third controlled circuit activates one of the fifth and sixth select lines in response to the second control signal and the first control signal.

90. A semiconductor memory device according to claim 89, wherein the first, second and third controlled circuits are respectively responsive to a first, second and third select line activation circuit.

91. A semiconductor memory device according to claim 90, wherein the first given potential relation is that both the first and second nodes are substantially at the first potential level; and wherein the second given potential relation is that the second terminal is substantially at a second potential level when the first terminal is substantially at the first potential level, and the first terminal is substantially at the second potential level when the second terminal is substantially at the first potential level.

92. A semiconductor memory device according to claim 90, wherein the first given potential relation is that when one of the first and second nodes is substantially at the first potential level, one of the third and fourth nodes is substantially at the second potential level, respectively, and wherein the second given potential relation is that both the first and second terminals are substantially at the same potential level.

93. A semiconductor memory device according to claim 90, wherein the first to fourth conductive portions are fuse elements.

94. A semiconductor memory device according to claim 90, wherein the first and second control signals are address signals.

95. A semiconductor memory device according to claim 90, wherein each of the first to sixth select lines comprises a plurality of word lines;

wherein the first select line activation circuit is responsive to the third control signal to thereby cause one word line of the first and second select lines to be active;

wherein the second select line activation circuit is responsive to the third control signal to thereby cause one word line among the third and fourth select lines to be active; and wherein the third select line activation circuit is responsive to the third control signal to thereby cause one word line among the fifth and sixth select lines to be active.

96. A semiconductor memory device according to claim 95, wherein each of the first to sixth select lines is activated when one of the word lines which belong thereto is active.

97. A semiconductor memory device according to claim 82, wherein the first terminal receives one of the first control signal and a signal synchronous with the first control signal;

wherein the first control signal is changed from the first potential level to, second potential level or is change from the second potential level to the first potential level; and wherein the second terminal receives a third control signal having the second given potential relation to the first control signal.

98. A semiconductor memory device according to claim 97, further including a second detecting circuit coupled to the first and second terminals for detecting that one of the first control signal and the signal synchronous with the first control signal and the third control signal have the second given potential relation;

wherein the second detecting circuit applies a fourth control signal to the first and third detecting circuits after the lapse of a first given time from a time of detection; and wherein the first and third detecting circuits applies the second control signal to the second and third controlled circuits after receiving the fourth control signal.

99. A semiconductor memory device according to claim 98, wherein the third node receives the first control signal at the lapse of a second given time from a time that the first terminal received the first control signal if the first and third conductive portions are blown; and wherein the first given time is longer than the second given time.

100. A semiconductor memory device according to claim 99,
wherein the second detecting circuit includes a delay circuit; and
wherein the first given time is set by the delay circuit.

101. A semiconductor memory device according to claim 97,
wherein the first terminal receives the first control signal through a first inverter circuit,
wherein the second terminal receives the third control signal through a second inverter circuit, and
wherein the drive circuit outputs the first and third control signals having the second given potential relation during an operating time and outputs the first and third control signals, both having the second potential level during a non-operating time.

102. A semiconductor memory device according to claim 101, wherein the first and second potential supply circuits cause the third and fourth nodes to be at the first potential level during the non-operating time.

103. A semiconductor memory device according to claim 102, further including a second detecting circuit coupled to the first and second terminals for detecting that one of the first control signal and the signal synchronous with the first control signal have the second given potential relation to the third control signal,
wherein the second detecting circuit applies a fourth control signal to the first and third detecting circuit at the lapse of a first given time from a time of detection, and
wherein the first and third detecting circuit applies the second control signal to the second and third controlled circuit after receiving the fourth control signal.

104. A semiconductor memory device according to claim 103,
wherein the first node receives the first control signal at the lapse of a second given time from a time that the first terminal received the first control signal if the first conductive portion is blown; and
wherein the first given time is longer than the second given time.

105. A semiconductor memory device according to claim 104,
wherein the second detecting circuit includes a delay circuit, and
wherein the first given time is set by the delay circuit.

106. A semiconductor memory device comprising:
a first main select line group including a first select line group having a plurality of select lines and a second select line group having a plurality of select lines;
a second main select line group including a third select line group having a plurality of select lines and a fourth select line group having a plurality of select lines;
a redundancy select line group including a fifth select line group having a plurality of select lines and a sixth select line group having a plurality of select lines;
a respective plurality of memory cells coupled to each of the select lines;
a first select line activation circuit for activating one of the select lines of the first select line group in response to control signals including a first control signal, the first select line activation circuit activating one of the select lines of the first select line group when the first control signal is at a first potential level and activating one of the select lines of the second select line group when the first control signal is at a second potential level;
a second select line activation circuit for activating one of the select lines of the second select line group in response to the control signals including the first control signal, the second select line activation circuit activating one of the select lines of the third select line group when the first control signal is at the first potential level and activating one of the select lines of the fourth select line group when the first control signal is at the second potential level;
a third select line activation circuit for activating one of the select lines of the redundancy select line group in response to the control signals including the first control signal, the third select line activation circuit activating one of the select lines of the fifth select line group when the first control signal is at the first potential level and activating one of the select lines of the sixth select line group when the first control signal is at the second potential level;
a first conductive line having a first terminal at one end thereof to receive the first control signal, a second terminal at the other end thereof, a first node and a second node connecting between the first and second terminals, a first conductive portion connecting between the first terminal and the first node and a second conductive portion connecting between the first node and the second node;
a first potential holding circuit for causing nodes coupled to the second terminal to be at one of the first and second potential levels when one of the first and second conductive portions is blown;
a second conductive line having a third terminal which is at the second potential level when the first control signal is at the first potential level and is at the first potential level when the first control signal is at the second potential level, the third terminal at one end of the second conductive line for receiving a second control signal, a fourth terminal at the other end thereof, third and fourth nodes connecting between the third and fourth terminals, a third conductive portion connecting between the third terminal and the third node and a fourth conductive portion connecting between the third node and the fourth node;
a second potential holding circuit for causing the nodes coupled to the fourth terminal to be at one of the first and second potential levels when one of the third and fourth conductive portions is blown;
first and second control signal generating circuits for outputting a third control signal of the control signals, wherein the first control signal generating circuit coupled to the first and third nodes enables the third control signal to be supplied to the second select line activation circuit when both of the first and third nodes are at one of the first and second potential levels, and enables the third control signal to be supplied to the first select line activation circuit when both of the first and third nodes are not at one of the first and second potential levels, and wherein the second control signal generating circuit is coupled to the second and fourth nodes and enables the third control signal to be supplied to the third select line activation circuit when both of the second and fourth nodes are at one of the first and second potential levels, and enables the third control signal to be supplied to the second select line activation circuit when both of the second and fourth nodes are not at one of the first and second potential levels.

* * * * *